United States Patent
Okuya

(10) Patent No.: US 10,910,234 B2
(45) Date of Patent: Feb. 2, 2021

(54) SUBSTRATE PROCESSING APPARATUS

(71) Applicant: SCREEN Holdings Co., Ltd., Kyoto (JP)

(72) Inventor: Yosuke Okuya, Kyoto (JP)

(73) Assignee: SCREEN Holdings Co., Ltd.

(*) Notice: Subject to any disclaimer, the term of this patent is extended or adjusted under 35 U.S.C. 154(b) by 292 days.

(21) Appl. No.: 15/874,290

(22) Filed: Jan. 18, 2018

(65) Prior Publication Data

US 2018/0240685 A1 Aug. 23, 2018

(30) Foreign Application Priority Data

Feb. 22, 2017 (JP) .................................. 2017-031484

(51) Int. Cl.
| | |
|---|---|
| *H01L 21/67* | (2006.01) |
| *F16K 7/17* | (2006.01) |
| *F16K 31/122* | (2006.01) |
| *B08B 3/02* | (2006.01) |

(52) U.S. Cl.
CPC .......... *H01L 21/67051* (2013.01); *B08B 3/02* (2013.01); *F16K 7/17* (2013.01); *F16K 31/122* (2013.01); *H01L 21/67017* (2013.01); *H01L 21/6719* (2013.01); *H01L 21/67023* (2013.01); *H01L 21/67028* (2013.01)

(58) Field of Classification Search
None
See application file for complete search history.

(56) References Cited

U.S. PATENT DOCUMENTS

| | | | |
|---|---|---|---|
| 6,116,267 A | 9/2000 | Suzuki et al. | ................ 137/340 |
| 2014/0029924 A1* | 1/2014 | Uchida | ................... F24H 1/121 |
| | | | 392/466 |
| 2015/0053285 A1 | 2/2015 | Nakashima et al. | ..... 137/565.11 |
| 2015/0375273 A1 | 12/2015 | Ishii et al. | |
| 2016/0240413 A1 | 8/2016 | Kobayashi et al. | |

FOREIGN PATENT DOCUMENTS

| | | |
|---|---|---|
| JP | 2004-111668 A | 4/2004 |
| JP | 2004-267965 A | 9/2004 |
| JP | 2006-336701 A | 12/2006 |

(Continued)

OTHER PUBLICATIONS

Espacenet translation, Liquid Feeder, Apr. 4, 2013, Sakai Takahiro (Year: 2013).*

*Primary Examiner* — Cristi J Tate-Sims
(74) *Attorney, Agent, or Firm* — Ostrolenk Faber LLP

(57) ABSTRACT

The substrate processing apparatus includes first supply piping which guides a processing liquid from a first branching portion to a first chemical liquid nozzle, first return piping which guides the processing liquid from the first branching portion to a tank, a first pressure-loss setting unit which sets a pressure loss so that a pressure loss through the first supply piping is larger than a pressure loss through the first return piping, and a first discharge valve which switches between a first discharge execution state in which the pressure loss through the first return piping is larger than the pressure loss through the first supply piping and a first discharge stop state in which the pressure loss through the first return piping is smaller than the pressure loss through the first supply piping.

17 Claims, 10 Drawing Sheets

(56) References Cited

FOREIGN PATENT DOCUMENTS

| | | |
|---|---|---|
| JP | 2009-158597 A | 7/2009 |
| JP | 2009-222189 A | 10/2009 |
| JP | 2010-038322 A | 2/2010 |
| JP | 2015-177090 A | 10/2015 |
| JP | 5887089 B2 | 2/2016 |
| JP | 2016-157855 A | 9/2016 |
| JP | 2017-034188 A | 2/2017 |
| KR | 10-2011-0065340 A | 6/2011 |
| TW | 368579 B | 9/1999 |
| TW | 201520718 A | 6/2015 |
| TW | I535496 B | 6/2016 |

\* cited by examiner

DISCHARGE IS EXECUTED

DISCHARGE IS STOPPED

SUBSTRATE PROCESSING APPARATUS

BACKGROUND OF THE INVENTION

1. Field of the Invention

The present invention relates to a substrate processing apparatus which processes a substrate. Substrates to be processed include, for example, semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

In manufacturing processes for semiconductor devices and liquid crystal displays, substrate processing apparatuses are used for processing substrates such as semiconductor wafers or glass panels for liquid crystal displays.

JP 2009222189 A discloses a single substrate processing type substrate processing apparatus which processes substrates one at a time. The substrate processing apparatus includes a spin chuck which rotates a substrate while horizontally holding the substrate and a processing liquid supplying device which supplies a processing liquid to the substrate held by the spin chuck. The processing liquid supplying device includes a nozzle which discharges the processing liquid toward the substrate, supply piping which supplies the processing liquid to the nozzle, and a valve which is interposed in the supply piping. The processing liquid flowing through the supply piping is supplied to the nozzle by opening the valve. Thereby, the processing liquid is discharged from the nozzle and supplied to the substrate. The valve is closed by causing a valve element to come into contact with a valve seat and opened by causing the valve element to move away from the valve seat.

When the valve is closed, the valve element comes into contact with the valve seat. However, due to the contact between the valve body and the valve seat, particles are generated inside the valve. In a state where the valve is closed, the processing liquid stays inside the valve. Therefore, no particles are expelled. When the valve is opened, the particles inside the valve are supplied to the nozzle together with the processing liquid. Then, the processing liquid containing the particles is discharged from the nozzle and supplied to the substrate, thus resulting in deterioration of cleanliness of the substrate. Even if a filter is disposed between the valve and the nozzle, one-time filtration is not able to sufficiently remove the particles.

SUMMARY OF THE INVENTION

A preferred embodiment of the present invention provides a substrate processing apparatus which includes a substrate holding unit which holds a substrate, a first nozzle which discharges a processing liquid toward the substrate held by the substrate holding unit, a tank which stores the processing liquid to be supplied to the first nozzle, circulation piping which circulates the processing liquid inside the tank, a liquid sending device which sends the processing liquid inside the tank to the circulation piping, a filter which removes foreign matter from the processing liquid flowing through the circulation piping, common piping which guides the processing liquid from the circulation piping to a first branching portion, first supply piping which guides the processing liquid guided by the common piping from the first branching portion to the first nozzle and which is always open such that the processing liquid flows from the first branching portion to the first nozzle through the first supply piping, first return piping which guides the processing liquid guided by the common piping from the first branching portion to the tank, a first pressure-loss setting unit which sets pressure losses such that a pressure loss through the first supply piping is larger than a pressure loss through the first return piping, and a first discharge valve which switches between a first discharge execution state in which the first discharge valve makes the pressure loss through the first return piping larger than the pressure loss through the first supply piping by decreasing a flow channel area of the first return piping such that the processing liquid inside the common piping flows from the common piping to the first supply piping, and a first discharge stop state in which the first discharge valve makes the pressure loss through the first return piping smaller than the pressure loss through the first supply piping by making the flow channel area of the first return piping larger than that in the first discharge execution state such that the processing liquid inside the common piping flows from the common piping to the first return piping.

According to this arrangement, the processing liquid inside the tank is sent by the liquid sending device to the circulation piping and returned from the circulation piping to the tank. The processing liquid inside the circulation piping is guided by the common piping to the first branching portion and supplied to the first supply piping or the first return piping. The processing liquid supplied to the first supply piping is discharged from the first nozzle and supplied to the substrate. Thereby, the substrate is processed. On the other hand, the processing liquid supplied to the first return piping is returned to the tank and circulated through the circulation piping again. Foreign matter contained in the processing liquid is removed by the filter during circulation through the circulation piping.

The pressure loss through the first supply piping is larger than the pressure loss through the first return piping and, therefore, the processing liquid is less likely to flow from the common piping to the first supply piping. Thus, the processing liquid inside the common piping mainly flows to the first return piping. The first discharge valve increases the pressure loss through the first return piping by decreasing the flow channel area of the first return piping. Thereby, the pressure loss through the first return piping is made larger than the pressure loss through the first supply piping, and the processing liquid flows from the common piping to the first supply piping. Thereafter, the first discharge valve increases the flow channel area of the first return piping, by which the pressure loss through the first return piping is made smaller than the pressure loss through the first supply piping. Thereby, supply of the processing liquid from the common piping to the first supply piping is stopped, and the processing liquid is supplied from the common piping to the first return piping.

As described above, execution of discharge of the processing liquid from the first nozzle and stop of discharge thereof are not switched by opening and closing the first supply piping with the use of an opening/closing valve, but by changing a magnitude relationship between the pressure loss through the first supply piping and the pressure loss through the first return piping. The first supply piping is not closed by the opening/closing valve but always open except for a period during which an abnormality is occurring. Therefore, the amount of foreign matter contained in the processing liquid supplied to the first nozzle is smaller than in the case of the first supply piping being opened and closed by using the opening/closing valve. It is, thereby, possible to suppress or prevent contamination of the substrate by foreign matter contained in the processing liquid and to improve the cleanliness of the substrate.

Further, since the first supply piping is always open, in a state where discharge of the processing liquid is stopped, a negative pressure resulting from the processing liquid flowing from the common piping to the first return piping is applied to an interior of the first supply piping. The processing liquid remaining in the first nozzle and the first supply piping is sucked by the negative pressure toward the first return piping and flows toward the first return piping. Thereby, the processing liquid remaining in the first nozzle and the first supply piping can be decreased in amount. As a result, it is possible to suppress or prevent occurrence of a phenomenon that droplets of the processing liquid drop intermittently from the first nozzle (what is called "dripping") although discharge of the processing liquid from the first nozzle is stopped.

In addition, even if the first discharge valve is not completely closed, that is, the valve element is not in contact with the valve seat when the opening degree is smallest, the first discharge valve has a movable portion. Therefore, particles can be generated at the first discharge valve. That is, particles may mix into the processing liquid flowing through the first return piping. However, the processing liquid flowing through the first return piping is returned to the tank to circulate through the circulation piping. Foreign matter contained in the processing liquid is removed by the filter during circulation through the circulation piping. Therefore, it is possible to avoid discharge of the particles generated at the first discharge valve together with the processing liquid from the first nozzle and also to suppress or prevent contamination of the substrate.

It is noted that an abnormality is a phenomenon in which, although discharge of the processing liquid from the first nozzle is stopped, the processing liquid is continuously discharged from the first nozzle. The first supply piping is always open except for a period during which an abnormality is occurring. Dripping, that is, a phenomenon in which, although discharge of the processing liquid from the first nozzle is stopped, droplets of the processing liquid dropping intermittently from the first nozzle are excluded from the above-described abnormality. That is, on occurrence of dripping, there is maintained a state where the first supply piping is opened. This is also applicable to an abnormality of the second nozzle.

The flow channel area is a cross sectional area of a space where the liquid flows orthogonal to a flow direction of the liquid. The first pressure-loss setting unit may set the pressure loss through the first supply piping by decreasing the flow channel area of the first supply piping or the first branching portion or may set the pressure loss through the first supply piping by decreasing the flow channel areas of both the first supply piping and the first branching portion. This is also applicable to a second pressure-loss setting unit which will be described later.

In the preferred embodiment, at least one of the following features may be added to the substrate processing apparatus.

The first pressure-loss setting unit includes at least one of an elevating portion which is a portion of the first supply piping and extends upward toward a downstream side in a flow direction of the processing liquid, a contracting portion which is a portion of the first supply piping and tapered toward the downstream side in the flow direction of the processing liquid and an orifice member which includes at least one through hole through which the processing liquid passes and arranged on the first supply piping.

The first pressure-loss setting unit includes an electric valve which includes a valve body defining an inner flow channel through which the processing liquid flows, a valve element which is arranged inside the inner flow channel and an electric actuator which makes the valve element stationary at any given position.

According to this arrangement, at least one of the elevating portion, the contracting portion, the orifice member and the electric valve is disposed on the first supply piping. Since the elevating portion extends upward, it is necessary to apply a positional energy to the processing liquid, thus resulting in an increased pressure loss through the first supply piping. The first supply piping is decreased in flow channel area by the contracting portion and the orifice member and, therefore, increased in pressure loss. Similarly, the first supply piping is decreased in flow channel area by the electric valve and, therefore, increased in pressure loss. Thereby, the pressure loss through the first supply piping can be larger than the pressure loss through the first return piping. Although the elevating portion, the contracting portion and the orifice member in particular are constant in flow channel area, the electric valve can be changed in flow channel area to any given value.

The contracting portion may be a cylindrical tapered portion with an inner diameter continuously decreasing toward a downstream side in a flow direction of the processing liquid or may be a cylindrical stepped portion with an inner diameter decreasing in stages toward the downstream side in the flow direction of the processing liquid or may include both of the tapered portion and the stepped portion.

Another preferred embodiment of the present invention provides a substrate processing apparatus which includes a substrate holding unit which holds a substrate, a first nozzle which discharges a processing liquid toward the substrate held by the substrate holding unit, a liquid sending device which sends the processing liquid supplied to the substrate held by the substrate holding unit, common piping which guides the processing liquid sent by the liquid sending device to a first branching portion, first supply piping which guides the processing liquid guided by the common piping from the first branching portion to the first nozzle and which is always open such that the processing liquid flows from the first branching portion to the first nozzle through the first supply piping, first return piping which guides the processing liquid guided by the common piping from the first branching portion along a channel different from the first supply piping, a first pressure-loss setting unit which sets pressure losses such that a pressure loss through the first supply piping is larger than a pressure loss through the first return piping, and a first discharge valve which switches between a first discharge execution state in which the first discharge valve makes the pressure loss through the first return piping larger than the pressure loss through the first supply piping by decreasing a flow channel area of the first return piping such that the processing liquid inside the common piping flows from the common piping to the first supply piping, and a first discharge stop state in which the first discharge valve makes the pressure loss through the first return piping smaller than the pressure loss through the first supply piping by making the flow channel area of the first return piping larger than that in the first discharge execution state such that the processing liquid inside the common piping flows from the common piping to the first return piping, in which the first pressure-loss setting unit includes at least one of an elevating portion which is a portion of the first supply piping and extends upward toward a downstream side in a flow direction of the processing liquid, a contracting portion which is a portion of the first supply piping and tapered toward the downstream side in the flow direction of the processing liquid, and an orifice member which includes at least one through hole through which the processing liquid passes and arranged on the first supply piping.

Still another preferred embodiment of the present invention provides a substrate processing apparatus which includes a substrate holding unit which holds a substrate, a first nozzle which discharges a processing liquid toward the substrate held by the substrate holding unit, a liquid sending device which sends the processing liquid to be supplied to the substrate held by the substrate holding unit, common piping which guides the processing liquid sent by the liquid sending device to a first branching portion, first supply piping which guides the processing liquid guided by the common piping from the first branching portion to the first nozzle and which is always open such that the processing liquid flows from the first branching portion to the first nozzle through the first supply piping, first return piping which guides the processing liquid guided by the common piping from the first branching portion along a channel different from the first supply piping, a first pressure-loss setting unit which sets pressure losses such that a pressure loss through the first supply piping is larger than a pressure loss through the first return piping, and a first discharge valve which switches between a first discharge execution state in which the first discharge valve makes the pressure loss through the first return piping larger than the pressure loss through the first supply piping by decreasing a flow channel area of the first return piping such that the processing liquid inside the common piping flows from the common piping to the first supply piping, and a first discharge stop state in which the first discharge valve makes the pressure loss through the first return piping smaller than the pressure loss through the first supply piping by making the flow channel area of the first return piping larger than that in the first discharge execution state such that the processing liquid inside the common piping flows from the common piping to the first return piping, in which the first pressure-loss setting unit includes an electric valve which includes a valve body defining an inner flow channel through which the processing liquid flows, a valve element which is arranged inside the inner flow channel and an electric actuator which makes the valve element stationary at any given position.

According to this arrangement, the processing liquid sent by the liquid sending device is guided by the common piping to the first branching portion and supplied to the first supply piping or the first return piping. The processing liquid supplied to the first supply piping is discharged from the first nozzle and supplied to the substrate. Thereby, the substrate is processed. On the other hand, the processing liquid supplied to the first return piping is guided to the tank or exhaust piping.

The pressure loss through the first supply piping is larger than the pressure loss through the first return piping. This is because at least one of the elevating portion, the contracting portion, the orifice member and the electric valve is disposed on the first supply piping. That is, since the elevating portion extends upward, it is necessary to apply a positional energy to the processing liquid, resulting in an increased pressure loss of the first supply piping. The first supply piping is decreased in flow channel area by the disposed contracting portion and the orifice member and, therefore, increased in pressure loss. Similarly, the first supply piping is decreased in flow channel area by the electric valve and, therefore, increased in pressure loss. Although the elevating portion, the contracting portion and the orifice member in particular are constant in flow channel area, the electric valve can be changed in flow channel area to any given value.

Since the processing liquid is less likely to flow from the common piping to the first supply piping, the processing liquid inside the common piping flows mainly to the first return piping. The first discharge valve increases the pressure loss through the first return piping by decreasing the flow channel area of the first return piping. Thereby, the pressure loss through the first return piping is made larger than the pressure loss through the first supply piping, resulting in flow of the processing liquid from the common piping to the first supply piping. Thereafter, the first discharge valve increases the flow channel area of the first return piping, thereby making smaller the pressure loss through the first return piping than the pressure loss through the first supply piping. Thereby, supply of the processing liquid from the common piping to the first supply piping is stopped, and the processing liquid is supplied from the common piping to the first return piping.

As described above, execution of discharge of the processing liquid from the first nozzle and stop of discharge thereof are not switched by opening and closing the first supply piping with the use of an opening/closing valve, but by changing a magnitude relationship between the pressure loss through the first supply piping and the pressure loss through the first return piping. The first supply piping is not closed by the opening/closing valve but always open except for a period during which abnormality is occurring. Therefore, the amount of foreign matter contained in the processing liquid supplied to the first nozzle is smaller than in the case of the first supply piping being opened and closed by using the opening/closing valve. It is, thereby, possible to suppress or prevent contamination of the substrate by foreign matter contained in the processing liquid and to improve the cleanliness of the substrate.

Further, since the first supply piping is always open, in a state where discharge of the processing liquid is stopped, a negative pressure resulting from the processing liquid flowing from the common piping to the first return piping is applied to an interior of the first supply piping. The processing liquid remaining in the first nozzle and the first supply piping is sucked by the negative pressure toward the first return piping and flows toward the first return piping. Thereby, the processing liquid remaining in the first nozzle and the first supply piping can be decreased in amount. As a result, it is possible to suppress or prevent occurrence of a phenomenon that droplets of the processing liquid drop intermittently from the first nozzle (what is called "dripping") although discharge of the processing liquid from the first nozzle is stopped.

A downstream end of the first return piping may be connected to the tank which stores the processing liquid to be supplied to the substrate or may be connected to the exhaust piping which guides the processing liquid outside the substrate processing apparatus. That is, the processing liquid supplied from the common piping to the first return piping may be collected or may not be collected.

At least one of the following features may be added to the substrate processing apparatuses according to the three preferred embodiments described above.

The first pressure-loss setting unit includes an elevating portion which is a portion of the first supply piping and extends upward toward a downstream side in a flow direction of the processing liquid. The substrate processing apparatus further includes a first liquid detecting sensor which detects whether the processing liquid is present in the elevating portion or not.

According to this arrangement, the presence or absence of the processing liquid at the elevating portion of the first supply piping is detected by the first liquid detecting sensor. When discharge of the processing liquid is stopped, the elevating portion can be expected to be empty. Further, when discharge of the processing liquid is executed, the elevating portion is to be filled with the processing liquid. After discharge of the processing liquid is stopped, the processing liquid remaining at the elevating portion flows toward the first return piping due to a suction force and gravity resulting from the processing liquid flowing from the common piping to the first return piping, by which the elevating portion can be expected to be empty.

Upon occurrence of the abnormality in which the processing liquid is supplied from the common piping to the first supply piping although discharge of the processing liquid is stopped, a liquid surface of the processing liquid rises along the elevating portion to fill the elevating portion with the processing liquid. It is possible to detect the above-described abnormality by detecting the presence or absence of the processing liquid at the elevating portion. It is also possible to confirm supply of the processing liquid to the first supply piping upon execution of discharge of the processing Liquid. Further, it is possible to confirm that the first supply piping is made empty after discharge of the processing liquid has been stopped.

The substrate processing apparatus further includes a controller which is configured and programmed to cause the liquid sending device to stop sending of the processing liquid if the first liquid detecting sensor detects that the processing liquid is present in the elevating portion when the first discharge valve is in the first discharge stop state.

According to this arrangement, upon occurrence of the abnormality in which the processing liquid is supplied from the common piping to the first supply piping although discharge of the processing liquid is stopped, the controller allows the liquid sending device to stop sending of the processing liquid. Thereby, it is possible to reliably prevent the first nozzle from continuously discharging the processing liquid although discharge of the processing liquid is stopped.

The first pressure-loss setting unit further includes an electric valve having a valve body defining an inner flow channel through which the processing liquid flows, a valve element which is arranged inside the inner flow channel and an electric actuator which makes the valve element stationary at any given position. The substrate processing apparatus further includes a controller which is configured and programmed to stop flow of the processing liquid through the first supply piping such that no processing liquid flows from the first branching portion to the first nozzle by closing the electric valve when the first discharge valve is in the first discharge stop state and the first liquid detecting sensor detects that the processing liquid is present in the elevating portion.

According to this arrangement, the electric valve is disposed on the first supply piping. The electric valve includes the electric actuator which makes the valve element stationary at any given position in a range from an open position at which the valve element is separated from the valve seat to a closed position at which the valve element is in contact with the valve seat. Upon occurrence of the abnormality in which the processing liquid is supplied from the common piping to the first supply piping although discharge of the processing liquid is stopped, the controller allows the electric actuator to move the valve element to the closed position. Thereby, the first supply piping is closed, thus making it possible to reliably prevent the first nozzle from continuously discharging the processing liquid, although discharge of the processing liquid is stopped.

The first pressure-loss setting unit includes an electric valve having a valve body defining an inner flow channel through which the processing liquid flows, a valve element which is arranged inside the inner flow channel and an electric actuator which makes the valve element stationary at any given position. The substrate processing apparatus further includes a controller which is configured and programmed to decrease an opening degree of the electric valve before the first discharge valve is switched from the first discharge execution state to the first discharge stop state.

According to this arrangement, the electric valve is disposed on the first supply piping. When discharge of the processing liquid is stopped, the controller decreases an opening degree of the electric valve, while maintaining a state where the valve element is separated from the valve seat. Thereby, the first supply piping is increased in pressure loss. Thereafter, the controller increases an opening degree of the first discharge valve to stop supply of the processing liquid from the common piping to the first supply piping. As described above, after an increase in pressure loss through the first supply piping, the opening degree of the first discharge valve is increased. It is, therefore, possible to smoothly stop discharge of the processing liquid, as compared with a case where the opening degree of the first discharge valve is increased without decreasing the opening degree of the electric valve.

The substrate processing apparatus further includes a first flowmeter which detects a flow rate of the processing liquid flowing through the common piping.

According to this arrangement, the first flowmeter detects a flow rate of the processing liquid flowing through the common piping. Since the pressure loss through the first supply piping is larger than the pressure loss through the first return piping, a larger resistance is applied to the processing liquid inside the common piping when discharge of the processing liquid is executed than when discharge of the processing liquid is stopped. Therefore, the processing liquid during execution of discharge of the processing liquid is smaller in flow rate than the processing liquid during stop of discharge of the processing liquid. Therefore, it is possible to confirm that the processing liquid flows from the common piping to the first supply piping by detecting the flow rate of the processing liquid flowing through the common piping.

The substrate processing apparatus further includes a chamber which houses the substrate holding unit, a fluid box which is arranged laterally of the chamber, and a temperature controller which changes a temperature of the processing liquid to be supplied to the first nozzle by at least one of heating and cooling at a position upstream of the first supply piping. The first branching portion is arranged inside the chamber or the fluid box.

According to this arrangement, the processing liquid supplied to the first nozzle is heated or cooled upstream of the first supply piping. When discharge of the processing liquid is stopped, the processing liquid is not supplied from the common piping to the first supply piping but supplied from the common piping to the first return piping. At this time, a temperature of the first supply piping is at or near a room temperature or a temperature close thereto. Therefore, immediately after discharge of the processing liquid is started, the processing liquid undergoes a change in temperature in the first supply piping or the first nozzle.

The first supply piping is shortened, thus making it possible to decrease a change in temperature of the processing liquid in the first supply piping. The first supply piping is made shorter as the first branching portion comes closer to the first nozzle. The first branching portion is arranged inside the chamber or the fluid box and relatively close to the first nozzle. Thereby, it is possible to shorten the first supply piping and also to decrease a change in temperature of the processing liquid in the first supply piping. Therefore, the processing liquid with a temperature close to an intended temperature can be supplied to the substrate from the beginning.

The temperature controller may be a heater which heats the processing liquid at a temperature higher than a room temperature (for example, 20° C. to 30° C.) or may be a cooler which cools the processing liquid at a temperature lower than a room temperature. Alternatively, it may include both functions of heating and cooling. Further, the temperature controller may be disposed on the common piping or may be disposed on a member which is arranged upstream of the common piping such as the tank and the circulation piping.

The substrate processing apparatus further includes a second nozzle which discharges the processing liquid toward the substrate held by the substrate holding unit and second supply piping which guides the processing liquid from the first supply piping to the second nozzle and which is always open such that the processing liquid flows from the first supply piping to the second nozzle through the second supply piping. The first pressure-loss setting unit sets a pressure loss through the first supply piping and the second supply piping such that the pressure loss through the first supply piping and the second supply piping is larger than the pressure loss through the first return piping. The first discharge valve switches between the first discharge execution state in which the first discharge valve makes the pressure loss through the first return piping larger than the pressure loss through the first supply piping and the second supply piping by decreasing the flow channel area of the first return piping such that the processing liquid inside the common piping flows from the common piping to the first supply piping and the second supply piping and the first discharge stop state in which the first discharge valve makes the pressure loss through the first return piping smaller than the pressure loss through the first supply piping and the second supply piping by making the flow channel area of the first return piping larger than that in the first discharge execution state such that the processing liquid inside the common piping flows from the common piping to the first return piping.

The common piping includes upstream common piping which guides the processing liquid sent by the liquid sending device, first downstream common piping which guides the processing liquid guided by the upstream common piping to the first branching portion, and second downstream common piping which guides the processing liquid guided by the upstream common piping to the second branching portion. And, the substrate processing apparatus further includes a second nozzle which discharges the processing liquid toward the substrate held by the substrate holding unit, second supply piping which guides the processing liquid guided by the common piping from the second branching portion to the second nozzle and which is always open such that the processing liquid flows from the second branching portion to the second nozzle through the second supply piping, second return piping which guides the processing liquid guided by the common piping from the second branching portion along a channel different from the second supply piping, a second pressure-loss setting unit which sets pressure losses such that a pressure loss through the second supply piping is larger than a pressure loss through the second return piping, and a second discharge valve which switches between a second discharge execution state in which the second discharge valve makes the pressure loss through the second return piping larger than the pressure loss through the second supply piping such that the processing liquid inside the common piping flows from the common piping to the second supply piping by decreasing a flow channel area of the second return piping, and a second discharge stop state in which the second discharge valve makes the pressure loss through the second return piping smaller than the pressure loss through the second supply piping such that the processing liquid inside the common piping flows from the common piping to the second return piping by making the flow channel area of the second return piping larger than that in the second discharge execution state. The second pressure-loss setting unit may include at least one of an elevating portion, a contracting portion, an orifice member and an electric valve or may include a member other than those described above.

The above and other objects, features, and effects of the present invention will become more apparent from the following detailed description of the preferred embodiments with reference to the attached drawings.

DETAILED DESCRIPTION OF PREFERRED EMBODIMENTS

Figure 1:
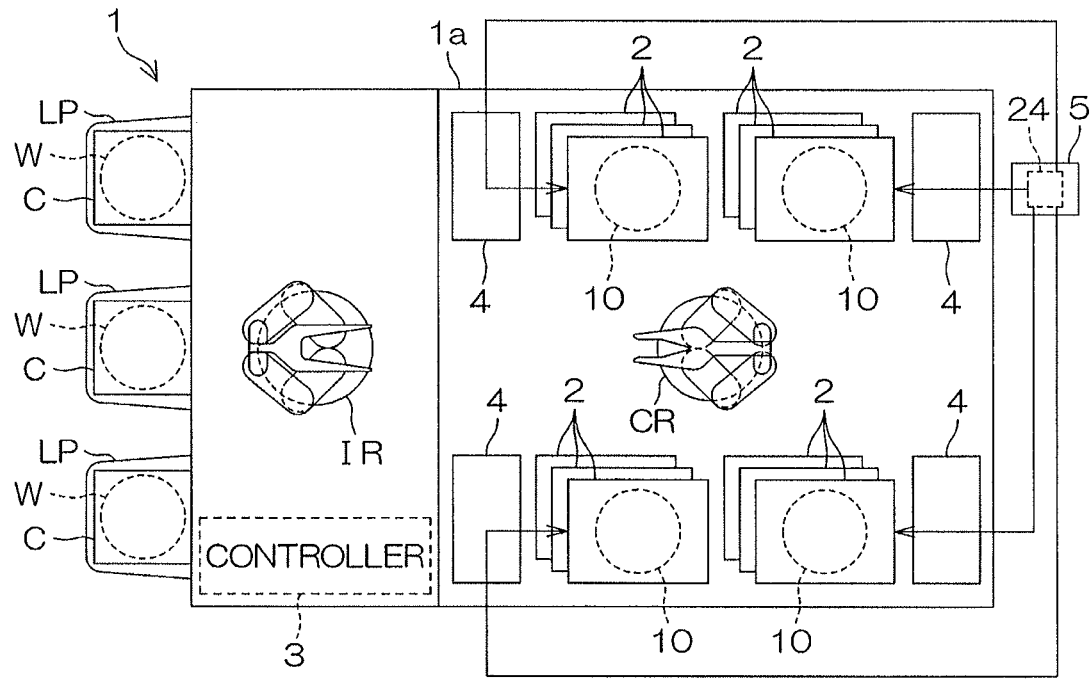
FIG. 1 is a schematic view which shows a substrate processing apparatus according to a first preferred embodiment of the present invention, when viewed from above.

FIG. 1 is a schematic view which shows a substrate processing apparatus 1 according to the first preferred embodiment of the present invention, when viewed from above.

The substrate processing apparatus 1 is a single substrate processing type apparatus which processes circular-plate shaped substrates W such as semiconductor wafers one at a time. The substrate processing apparatus 1 includes a plurality of load ports which hold a plurality of carriers C that house substrates W, a plurality of processing units 2 which process the substrates W transferred from the plurality of load ports by using a processing fluid such as a processing liquid or a processing gas, and a controller 3 that controls the substrate processing apparatus 1. The controller 3 is a computer which includes a storage portion that stores information such as programs and an arithmetic portion that controls the substrate processing apparatus 1 according to the information stored at the storage portion.

The substrate processing apparatus 1 further includes a transfer robot which transfers a substrate W between the load port and the processing unit 2. The transfer robot includes an indexer robot IR and a center robot CR. The indexer robot IR transfers the substrate W between the load port and the center robot CR. The center robot CR transfers the substrate W between the indexer robot IR and the processing unit 2. The indexer robot IR and the center robot CR include a hand which supports the substrate W.

The substrate processing apparatus 1 includes a plurality of (for example, four) fluid boxes 4, each of which houses a fluid device such as a first discharge valve 34A which will be described later. The processing unit 2 and the fluid box 4 are arranged inside an outer wall 1a of the substrate processing apparatus 1 and covered with the outer wall 1a of the substrate processing apparatus 1. A chemical liquid cabinet 5 which houses a tank 24, etc., which will be described later is arranged outside the outer wall 1a of the substrate processing apparatus 1. The chemical liquid cabinet 5 may be arranged laterally of the substrate processing apparatus 1 or may be arranged below a clean room in which the substrate processing apparatus 1 is installed (underground).

The plurality of processing units 2 form a plurality of (for example, four) towers arranged so as to surround the center robot CR in a plan view. Each of the towers includes the plurality of (for example, three) processing units 2 which are stacked vertically. The four fluid boxes 4 correspond individually to the four towers. A chemical liquid inside the chemical liquid cabinet 5 is supplied via any of the fluid boxes 4 to all the processing units 2 included in the tower corresponding to these fluid boxes 4.

Figure 2:
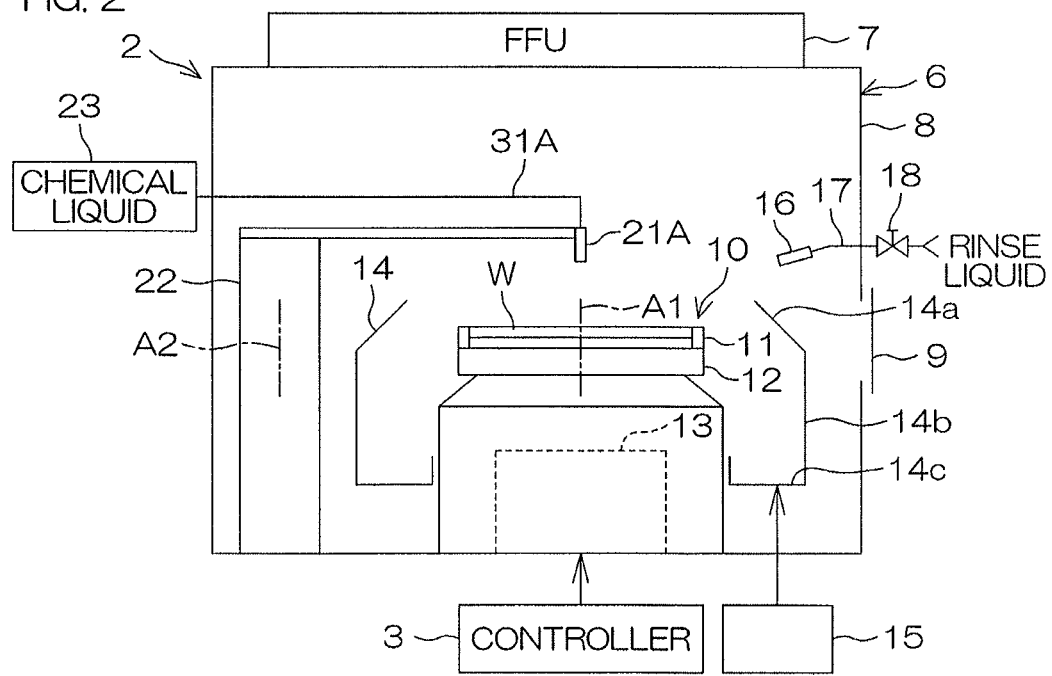
FIG. 2 is a schematic view which shows an interior of a processing unit when viewed horizontally.

FIG. 2 is a schematic view which shows an interior of the processing unit 2 when viewed horizontally.

The processing unit 2 includes a box-shaped chamber 6 which has an inner space, a spin chuck 10 which rotates a substrate W around a perpendicular rotation axis A1 passing through a central portion of the substrate W while horizontally holding the substrate W inside the chamber 6, and a cylindrical cup 14 which receives a processing liquid expelled from the substrate W. The spin chuck 10 is one example of the substrate holding unit.

The chamber 6 includes a box-shaped partition wall 8 on which a carry-in/carry-out port through which the substrate W passes is disposed, a shutter 9 which opens and closes the carry-in/carry-out port and an FFU 7 (fan filter unit) which produces a downflow of clean air which is air filtered by the filter inside the chamber 6. The center robot CR carries the substrate W in the chamber 6 through the carry-in/carry-out port and carries out the substrate W from the chamber 6 through the carry-in/carry-out port.

The spin chuck 10 includes a circular-plate shaped spin base 12 which is held in a horizontal posture, a plurality of chuck pins 11 which hold the substrate W in a horizontal posture above the spin base 12, and a spin motor 13 which rotates the substrate W around the rotation axis A1 by rotating the plurality of chuck pins 11. The spin chuck 10 is not limited to a clamping type chuck which allows the plurality of chuck pins 11 to be in contact with an outer circumferential surface of the substrate W but may be a vacuum type chuck which horizontally holds the substrate W by allowing a rear surface (lower surface) of the substrate W which is a non-device forming surface to adhere on an upper surface of the spin base 12.

The cup 14 includes a cylindrical inclined portion 14a which extends obliquely upward toward the rotation axis A1, a circular cylindrical guide portion 14b which extends downward from a lower end portion (outer end portion) of the inclined portion 14a, and a liquid receiving portion 14c which forms an annular groove opened upwardly. The inclined portion 14a includes a circular annular upper end which is larger in inner diameter than the substrate W and the spin base 12. An upper end of the inclined portion 14a corresponds to an upper end of the cup 14. The upper end of the cup 14 surrounds the substrate W and the spin base 12 in a plan view.

The processing unit 2 includes a cup elevating/lowering unit 15 which elevates and lowers the cup 14 perpendicularly between an upper position (the position shown in FIG. 2) at which the upper end of the cup 14 is positioned above a holding position at which the spin chuck 10 holds the substrate W and a lower position at which the upper end of the cup 14 is positioned below from the holding position. When the processing liquid is supplied to the substrate W, the cup 14 is arranged at the upper position. The processing liquid scattered outward from the substrate W is received by the inclined portion 14a and, thereafter, collected by the guide portion 14b into the liquid receiving portion 14c.

The processing unit 2 includes a rinse liquid nozzle 16 which discharges downward a rinse liquid to an upper surface of the substrate W held by the spin chuck 10. The rinse liquid nozzle 16 is connected to rinse liquid piping 17 on which a rinse liquid valve 18 is disposed. The processing unit 2 may include a nozzle movement unit which horizontally moves the rinse liquid nozzle 16 between a processing position at which the rinse liquid discharged from the rinse liquid nozzle 16 is supplied to the substrate W and a retracted position at which the rinse liquid nozzle 16 is separated from the substrate W in a plan view.

When the rinse liquid valve 18 is opened, the rinse liquid is supplied from the rinse liquid piping 17 to the rinse liquid nozzle 16 and discharged from the rinse liquid nozzle 16. The rinse liquid is, for example, pure water (deionized water). The rinse liquid is not limited to pure water but may be any one of carbonated water, electrolytic ion water, hydrogen water, ozone water and hydrochloric acid water with a diluted concentration (for example, approximately 10 to 100 ppm).

The processing unit 2 includes a first chemical liquid nozzle 21A which discharges downward a chemical liquid to the upper surface of the substrate W held by the spin chuck 10 and a nozzle movement unit 22 which horizontally moves the first chemical liquid nozzle 21A between a processing position at which the chemical liquid discharged from the first chemical liquid nozzle 21A is supplied to the upper surface of the substrate W and a retracted position at which the first chemical liquid nozzle 21A is separated from the substrate W in a plan view. The nozzle movement unit 22 is, for example, a turning unit which horizontally moves the first chemical liquid nozzle 21A around an oscillation axis A2 extending perpendicularly around the cup 14.

The substrate processing apparatus 1 includes a chemical liquid supplying device 23 which supplies a chemical liquid to the first chemical liquid nozzle 21A. The chemical liquid supplying device 23 will be described later. The chemical liquid supplied to the first chemical liquid nozzle 21A is a liquid which includes at least any one of sulfuric acid, acetic acid, nitric acid, hydrochloric acid, hydrofluoric acid, phosphoric acid, acetic acid, ammonia water, hydrogen peroxide water, an organic acid (for example, citric acid, oxalic acid, etc.) an organic alkali (for example, TMAH: tetramethylammonium hydroxide, etc.), a surfactant and a corrosion inhibitor. A liquid other than the above-described liquids may be supplied to the first chemical liquid nozzle 21A.

Figure 3:
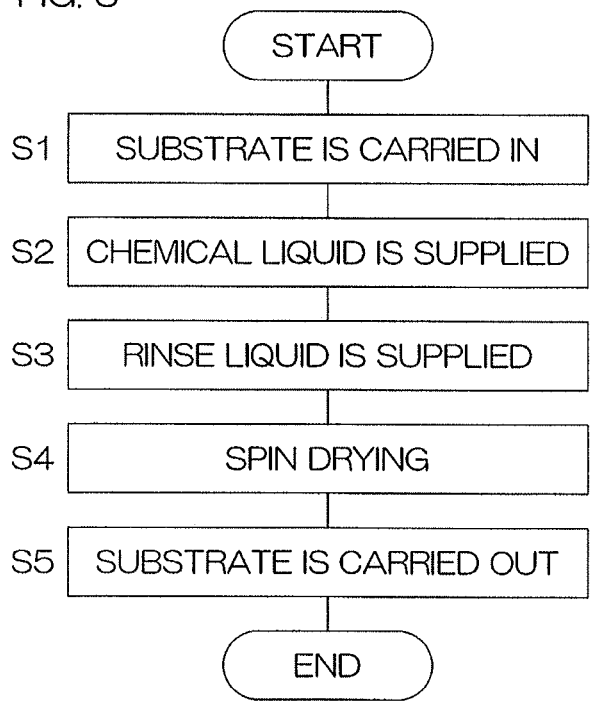
FIG. 3 is a process drawing for describing one example of substrate processing executed by the substrate processing apparatus.

FIG. 3 is a process drawing for describing one example of processing of the substrate W which is executed by the substrate processing apparatus 1. The controller 3 controls the substrate processing apparatus 1 to execute each of the following processes. In other words, the controller 3 is programmed so as to execute each of the following processes. Hereinafter, FIG. 1 to FIG. 3 will be referred to.

When the substrate W is processed by the substrate processing apparatus 1, there is performed a carry-in process in which the substrate W is carried into the chamber 6 (Step S1 in FIG. 3).

Specifically, in a state where the first chemical liquid nozzle 21A is retracted from above the substrate W and the cup 14 is positioned at the lower position, the center robot CR (refer to FIG. 1) allows the hand to advance into the chamber 6, while supporting the substrate W with the hand. Thereafter, the center robot CR places the substrate W on the hand onto the spin chuck 10, with the front surface of the substrate W pointed above. After the substrate W is held by the chuck pin 11, the spin motor 13 starts rotation of the substrate W. The center robot CR allows the hand to retract from the interior of the chamber 6, after the substrate W has been placed on the spin chuck 10.

Next, there is performed a chemical liquid supplying process in which the chemical liquid is supplied to the substrate W (Step S2 in FIG. 3).

Specifically, the nozzle movement unit 22 moves the first chemical liquid nozzle 21A to the processing position, and the cup elevating/lowering unit 15 elevates the cup 14 up to the upper position. Thereafter, the chemical liquid supplying device 23 starts to supply the chemical liquid to the first chemical liquid nozzle 21A, and the first chemical liquid nozzle 21A discharges the chemical liquid. When the first chemical liquid nozzle 21A discharges the chemical liquid, the nozzle movement unit 22 may move the first chemical liquid nozzle 21A between a central processing position at which the chemical liquid discharged from the first chemical liquid nozzle 21A lands on a central portion of the upper surface of the substrate W and an outer circumferential processing position at which the chemical liquid discharged from the first chemical liquid nozzle 21A lands on an outer circumferential portion of the upper surface of the substrate W or may make the first chemical liquid nozzle 21A stationary so that a position on which the chemical liquid lands is at the central portion of the upper surface of the substrate W.

The chemical liquid discharged from the first chemical liquid nozzle 21A lands on the upper surface of the substrate W and, thereafter, flows outward along the upper surface of the rotating substrate W. Thereby, a liquid film which covers an entire area of the upper surface of the substrate W is formed by the chemical liquid, and the chemical liquid is supplied to an entire area of the upper surface of the substrate W. In particular, where the nozzle movement unit 22 moves the first chemical liquid nozzle 21A between the central processing position and the outer circumferential processing position, the entire area of the upper surface of the substrate W is scanned at a position on which the chemical liquid lands. Therefore, the chemical liquid is supplied uniformly to an entire area of the upper surface of the substrate W. Thereby, the upper surface of the substrate W is uniformly processed. After the elapse of a predetermined period of time from start of supply of the chemical liquid to the first chemical liquid nozzle 21A, supply of the chemical liquid to the first chemical liquid nozzle 21A is stopped. Thereafter, the nozzle movement unit 22 moves the first chemical liquid nozzle 21A to the retracted position.

Next, there is performed a rinse liquid supplying process in which pure water that is one example of the rinse liquid is supplied to the upper surface of the substrate W (Step S3 in FIG. 3).

Specifically, the rinse liquid valve 18 is opened, and the rinse liquid nozzle 16 starts to discharge pure water. The pure water landing on the upper surface of the substrate W flows outward along the upper surface of the rotating substrate W. The chemical liquid on the substrate W is washed away by the pure water discharged from the rinse liquid nozzle 16. Thereby, a liquid film of pure water is formed so as to cover an entire area of the upper surface of the substrate W. After the elapse of a predetermined period of time from when the rinse liquid valve 18 is opened, the rinse liquid valve 18 is closed to stop discharge of the pure water.

Next, there is performed a drying process in which the substrate W is dried by rotation of the substrate W (Step S4 in FIG. 3).

Specifically, the spin motor 13 accelerates rotation of the substrate W in a rotation direction, thereby rotating the substrate W at a high rotation speed (for example, several thousand rotations per minute) which is higher than a rotation speed of the substrate W in the chemical liquid supplying process and the rinse liquid supplying process. Thereby, the liquid is removed from the substrate W to dry the substrate W. After the elapse of a predetermined period of time from start of high speed rotation of the substrate W, the spin motor 13 stops rotating. Thereby, rotation of the substrate W is stopped.

Next, there is performed a carry-out process in which the substrate W is carried out from the chamber 6 (Step S5 in FIG. 3).

Specifically, the cup elevating/lowering unit 15 lowers the cup 14 to the lower position. Thereafter, the center robot CR (refer to FIG. 1) allows the hand to advance into the chamber 6. After release of the substrate W held by the plurality of chuck pins 11, the center robot CR supports the substrate W on the spin chuck 10 with the hand. Thereafter, the center robot CR allows the hand to retract from the interior of the chamber 6, while supporting the substrate W with the hand. Thereby, the substrate W which has been processed is carried out from the chamber 6.

Figure 4:
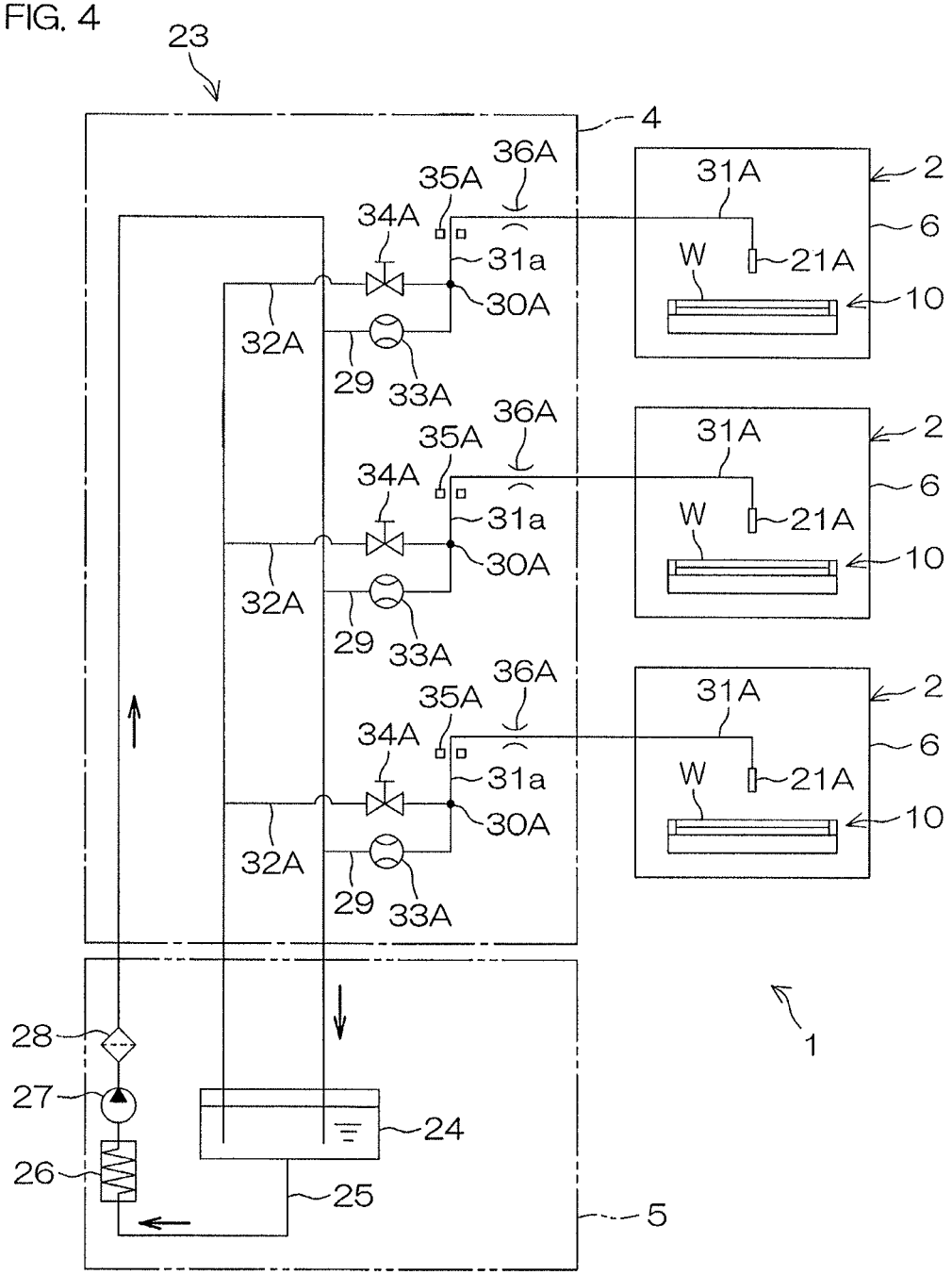
FIG. 4 is a schematic view which shows a chemical liquid supplying device according to the first preferred embodiment of the present invention.

FIG. 4 is a schematic view which shows the chemical liquid supplying device 23 according to the first preferred embodiment of the present invention. In FIG. 4, the fluid box 4 is shown by the single dotted and dashed line, and the chemical liquid cabinet 5 is shown by the double dotted and dashed line. This is also applicable to FIG. 9 to FIG. 11 and FIG. 13 to FIG. 15 which will be described later. Members arranged in a region surrounded by the single dotted and dashed line are arranged inside the fluid box 4, and members arranged in a region surrounded by the double dotted and dashed line are arranged inside the chemical liquid cabinet 5.

The substrate processing apparatus 1 includes the plurality of chemical liquid supplying devices 23 individually corresponding to the plurality of towers formed by the plurality of processing units 2. The chemical liquid supplying device 23 supplies a chemical liquid to all the processing units 2 included in the same tower. FIG. 4 shows one chemical liquid supplying device 23 and three processing units 2 corresponding to this chemical liquid supplying device 23.

The chemical liquid supplying device 23 includes a tank 24 that stores a chemical liquid supplied to the substrate W and circulation piping 25 which defines an annular circulation channel that circulates the chemical liquid inside the tank 24. The chemical liquid supplying device 23 further includes a pump 27 which sends the chemical liquid inside the tank 24 to the circulation piping 25, a filter 28 which removes foreign matter such as particles from the chemical liquid and an upstream heater 26 which adjusts a temperature of the chemical liquid inside the tank 24 by heating the chemical liquid. The pump 27, the filter 23 and the upstream heater 26 are interposed in the circulation piping 25.

The pump 27 constantly sends the chemical liquid inside the tank 24 into the circulation piping 25. The chemical liquid supplying device 23 may be provided, in place of the pump 27, with a pressure device in which an atmospheric pressure inside the tank 24 is raised to push out the chemical liquid inside the tank 24 to the circulation piping 25. Any of the pump 27 and the pressure device is one example of the liquid sending device which sends the chemical liquid inside the tank 24 to the circulation piping 25.

Upstream and downstream ends of the circulation piping 25 are connected to the tank 24. The chemical liquid is sent from the tank 24 to the upstream end of the circulation piping 25 and returned from the downstream end of the circulation piping 25 to the tank 24. Thereby, the chemical liquid inside the tank 24 is circulated through the circulation channel. During circulation of the chemical liquid through the circulation channel, foreign matter contained in the chemical liquid is removed by the filter 28 and the chemical liquid is heated by the upstream heater 26. Thereby, the chemical liquid inside the tank 24 is maintained at a constant temperature higher than a room temperature.

The chemical liquid supplying device 23 includes a plurality of sets, each of which is composed of common piping 29, a first branching portion 30A, first supply piping 31A and first return piping 32A so as to correspond to each of the plurality of processing units 2. An upstream end of the common piping 29 is connected to the circulation piping 25, and a downstream end of the common piping 29 is connected to the first branching portion 30A. An upstream end of the first supply piping 31A is connected to the first branching portion 30A, and a downstream end of the first supply piping 31A is connected to the first chemical liquid nozzle 21A. An upstream end of the first return piping 32A is connected to the first branching portion 30A, and a downstream end of the first return piping 32A is connected to the chemical liquid tank 24.

The chemical liquid flowing through the circulation piping 25 flows from the circulation piping 25 to the common piping 29 and flow via the first branching portion 30A from the common piping 29 to the first supply piping 31A or the first return piping 32A. The chemical liquid supplied to the first supply piping 31A is discharged from the first chemical liquid nozzle 21A and supplied to the substrate W. Thereby, the substrate W is processed. On the other hand, the chemical liquid supplied to the first return piping 32A is returned to the tank 24 to circulate through the circulation piping 25 again. Foreign matter contained in the chemical liquid is removed by the filter 23 during circulation through the circulation piping 25.

The chemical liquid supplying device 23 includes a plurality of sets, each of which is composed of a first flowmeter 33A, a first discharge valve 34A, a first liquid detecting sensor 35A and a first narrowing device 36A so as to correspond to each of the plurality of processing units 2. The first flowmeter 33A detects a flow rate of the chemical liquid flowing through the common piping 29. The first discharge valve 34A increases and decreases a flow channel area of the first return piping 32A. The first liquid detecting sensor 35A detects whether the chemical liquid is present at a detection position inside the first supply piping 31A or not. The first liquid detecting sensor 35A is, for example, a capacitance sensor. The first narrowing device 36A decreases a flow channel area of the first supply piping 31A, thereby increasing a pressure loss through the first supply piping 31A.

Figure 5:
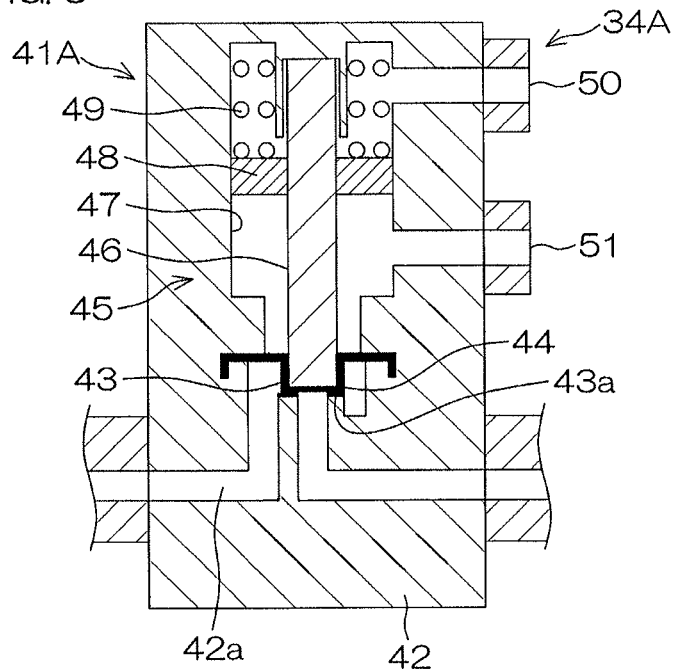
FIG. 5 is a schematic cross sectional view for showing a perpendicular cross section of an opening/closing valve.

FIG. 5 is a schematic cross sectional view which shows a perpendicular cross section of an opening/closing valve 41A. The first discharge valve 34A is the opening/closing valve 41A shown in FIG. 5. The opening/closing valve 41A is, for example, a diaphragm valve. The opening/closing valve 41A may include any other types. The opening/closing valve 41A includes a valve body 42 which forms an inner flow channel 42a through which the chemical liquid flows and a valve element 43 which is arranged inside the inner flow channel 42a. In the example shown in FIG. 5, the valve element 43 is a diaphragm. The valve element 43 includes an annular portion 43a which is in contact with an annular valve seat 44 disposed on the inner flow channel 42a. The opening/closing valve 41A further includes a valve actuator 45 which actuates the valve element 43 between an open position at which the valve element 43 is separated from the valve seat 44 and a closed position at which the valve element 43 comes into contact with the valve seat 44 to close the inner flow channel 42a.

The valve actuator 45 shown in FIG. 5 is, for example, a pneumatic actuator which actuates the valve element 43 by air pressure. The valve actuator 45 includes a rod 46 which moves together with the valve element 43, a cylinder 47 which surrounds the rod 46, and a piston 48 which divides the interior of the cylinder 47 into a first chamber and a second chamber. The valve actuator 45 further includes a spring 49 which generates a force to move the rod 46 and the valve element 43 to the closed position by pushing the piston 48 to the valve element 43, a first port 50 which is connected to the first chamber, and a second port 52 which is connected to the second chamber. The spring 49 is arranged in the first chamber.

The valve element 43 is pressed to the valve seat 44 by a force of the spring 49. Air pressure is supplied to raise an atmospheric pressure of the second chamber higher than that of the first chamber, by which the piston 48 moves in a direction of the first chamber, that is, a direction of moving away from the valve element 43. Thereby, the valve element 43 is separated from the valve seat 44 to open the inner flow channel 42*a*. When the second chamber is lowered in atmospheric pressure, the piston 48 returns toward the valve element 43 by a force of the spring 49. Thereby, the valve element 43 comes into contact with the valve seat 44 to close the inner flow channel 42*a*.

Figure 6:
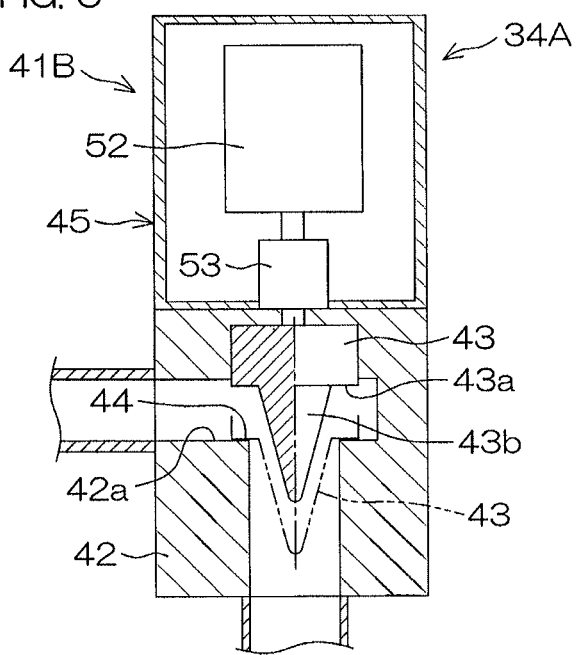
FIG. 6 is a schematic cross sectional view which shows a perpendicular cross section of a flow control valve.

FIG. 6 is a schematic cross sectional view which shows a perpendicular cross section of a flow control valve 41B. The first discharge valve 34A may be the flow control valve 41B shown in FIG. 6. The flow control valve 41B shown in FIG. 6 is a needle valve. The flow control valve 41B may include any other types thereof. The flow control valve 41B includes a valve body 42 which forms an inner flow channel 42*a* through which the chemical liquid flows and a valve element 43 which is arranged inside the inner flow channel 42*a*. In the example shown in FIG. 6, the valve element 43 is a needle. The valve element 43 includes an annular portion 43*a* which is in contact with an annular valve seat 44 disposed on the inner flow channel 42*a* and a conical portion 43*b* coaxial to the valve seat 44. The flow control valve 41B further includes a valve actuator 45 which makes the valve element 43 stationary at any given position in a range from an open position (the position shown by the solid line) at which the valve element 43 is separated from the valve seat 44 to a closed position (the position shown by the double dotted and dashed line) at which the valve element 43 comes into contact with the valve seat 44 to close the inner flow channel 42*a*.

The valve actuator 45 shown in FIG. 6 is, for example, an electric actuator which electrically actuates the valve element 43. The valve actuator 45 includes an electric motor 52 which generates a force to move the valve element 43 in an axial direction of the valve element 43 and a motion conversion mechanism 53 which converts rotation of the electric motor 52 to linear motion of the valve element 43 in the axial direction of the valve element 43. The valve element 43 moves in the axial direction of the valve element 43 according to rotation of the electric motor 52. The electric motor 52 is controlled for a rotation angle by the controller 3.

When the electric motor 52 rotates forward, the annular portion 43*a* of the valve element 43 comes close to the valve seat 44. When the electric motor 52 rotates reversely, the annular portion 43*a* of the valve element 43 moves away from the valve seat 44. An annular space between the conical portion 43*b* of the valve element 43 and the valve seat 44 is increased or decreased in area in association with movement of the valve element 43. Thereby, the opening degree of the flow control valve 41B is changed. Further, the valve element 43 is arranged at the closed position and the annular portion 43*a* of the valve element 43 is pressed to the valve seat 44, by which the inner flow channel 42*a* is closed to close the flow control valve 41B.

Figure 7:
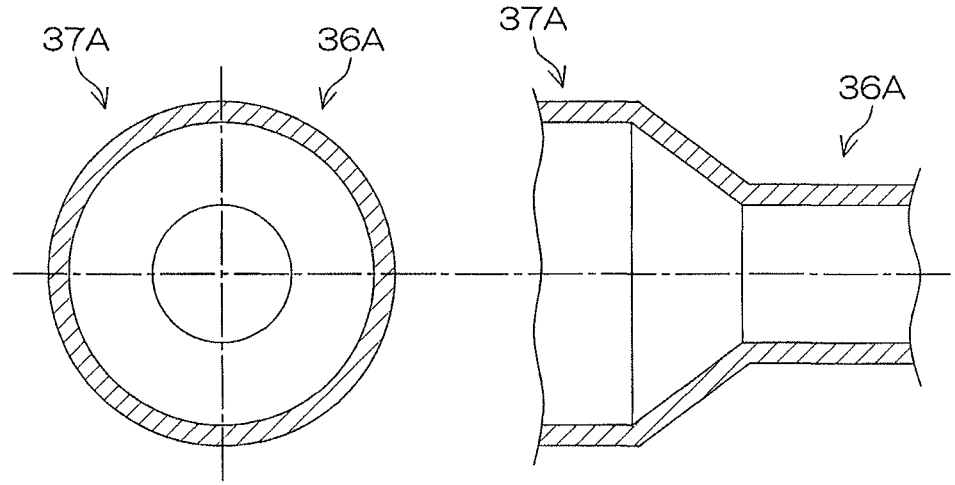
FIG. 7 is a schematic cross sectional view which shows a cross section of a contracting portion. On the left side of FIG. 7, there is shown a cross section orthogonal to a direction at which a chemical liquid flows, and on the right side of FIG. 7, there is shown a cross section along a cut plane including a center line of the contracting portion.
Figure 8:
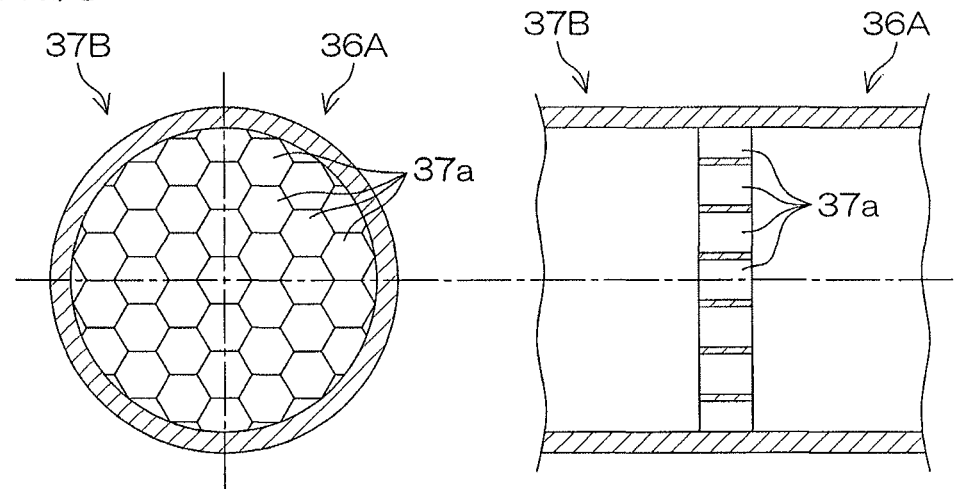
FIG. 8 is a schematic cross sectional view which shows a cross section of an orifice member. On the left side of FIG. 8 there is shown a drawing of the orifice member which is viewed in a direction at which the chemical liquid flows, and on the right side of FIG. 8, there is shown a cross section along a cut plane including a center line of the orifice member.

FIG. 7 is a schematic cross sectional view which shows a cross section of a contracting portion 37A. The left side of FIG. 7 shows a cross section orthogonal to a direction at which the chemical liquid flows, and the right side of FIG. 7 shows a cross section along a cut plane including a center line of the contracting portion 37A. FIG. 8 is a schematic cross sectional view which shows a cross section of an orifice member 37B. The left side of FIG. 8 shows a drawing in which the orifice member 37B is viewed in a direction at which the chemical liquid flows, and the right side of FIG. 8 shows a cross section along a cut plane including a center line of the orifice member 37B.

The first narrowing device 36A may be the contracting portion 37A shown in FIG. 7 or may be the orifice member 37B shown in FIG. 8. The contracting portion 37A shown in FIG. 7 is continuously narrowed in inner diameter toward the downstream flow of the chemical liquid in the first supply piping 31A. The inner diameter of the contracting portion 37A may be narrowed in stages. The orifice member 37B shown in FIG. 8 has one or more through holes 37*a* which penetrate through the orifice member 37B in a thickness direction of the orifice member 37B, that is, a direction at which the chemical liquid flows. FIG. 8 shows an example in which the plurality of through holes 37*a* are disposed on the orifice member 37B and the through hole 37*a* is in the shape of hexagon, when viewed in a direction at which the chemical liquid flows.

The first narrowing device 36A is disposed on the first supply piping 31A. FIG. 4 shows an example in which the first narrowing device 36A is arranged downstream of the first liquid detecting sensor 35A. The first narrowing device 36A may be arranged upstream of the first liquid detecting sensor 35A. The first narrowing device 36A decreases a flow channel area of the first supply piping 31A to increase a pressure loss through the first supply piping 31A. The first narrowing device 36A decreases the flow channel area of the first supply piping 31A but does not completely close the first supply piping 31A. Therefore, the chemical liquid is allowed to pass constantly through the first narrowing device 36A.

The first narrowing device 36A sets a pressure loss through the first supply piping 31A, together with the elevating portion 31*a* of the first supply piping 31A, so that the pressure loss through the first supply piping 31A can be larger than a pressure loss through the first return piping 32A. As shown in FIG. 4, the elevating portion 31*a* extends upward toward a downstream flow of the chemical liquid in the first supply piping 31A. The elevating portion 31*a* may extend in a perpendicular direction or extend obliquely in relation to a horizontal plane. The first liquid detecting sensor 35A is attached to the elevating portion 31*a*. An upper end portion of the elevating portion 31*a* is arranged above from the first liquid detecting sensor 35A.

When the first discharge valve 34A is largest in opening degree, that is, the first discharge valve 34A is fully opened, the pressure loss through the first supply piping 31A is larger than the pressure loss through the first return piping 32A. The pressure loss through the first return piping 32A is increased and decreased depending on a change in flow channel area of the first return piping 32A. The first discharge valve 34A changes the opening degree of the first discharge valve 34A, thereby increasing and decreasing a flow channel area of the first return piping 32A. The first discharge valve 34A increases and decreases the flow channel area of the first return piping 32A, thereby changing a magnitude relationship between the pressure loss through the first supply piping 31A and the pressure loss through the first return piping 32A.

Specifically, the first discharge valve 34A moves the valve element 43 between a discharge execution position at which the pressure loss through the first return piping 32A is larger than the pressure loss through the first supply piping 31A and a discharge stop position at which the pressure loss through the first return piping 32A is smaller than the pressure loss through the first supply piping 31A. The discharge execution position is a closed position at which the valve element 43 is in contact with the valve seat 44, and the discharge stop position is an open position at which the valve element 43 is separated from the valve seat 44.

Where the first discharge valve 34A is the flow control valve 41B shown in FIG. 6, the discharge execution position may be an intermediate open position between the open position (fully opened position) and the closed position. The intermediate open position is a position at which the valve element 43 is separated from the valve seat 44. An opening degree of the flow control valve 41B when the valve element 43 is arranged at the intermediate open position is smaller than that of the flow control valve 41B when the valve element 43 is arranged at the fully opened position.

The controller 3 switches a state of the first discharge valve 34A between a first discharge stop state in which the valve element 43 is positioned at the discharge stop position and a first discharge execution state in which the valve element 43 is positioned at the discharge execution position. Thereby, discharge of the chemical liquid from the first chemical liquid nozzle 21A is controlled. Hereinafter, reference is made to FIG. 9 and FIG. 10 to describe the chemical liquid supplying device 23 in the first discharge execution state in which the chemical liquid is discharged from the first chemical liquid nozzle 21A and in the first discharge stop state in which discharge of the chemical liquid from the first chemical liquid nozzle 21A is stopped.

Figure 9:
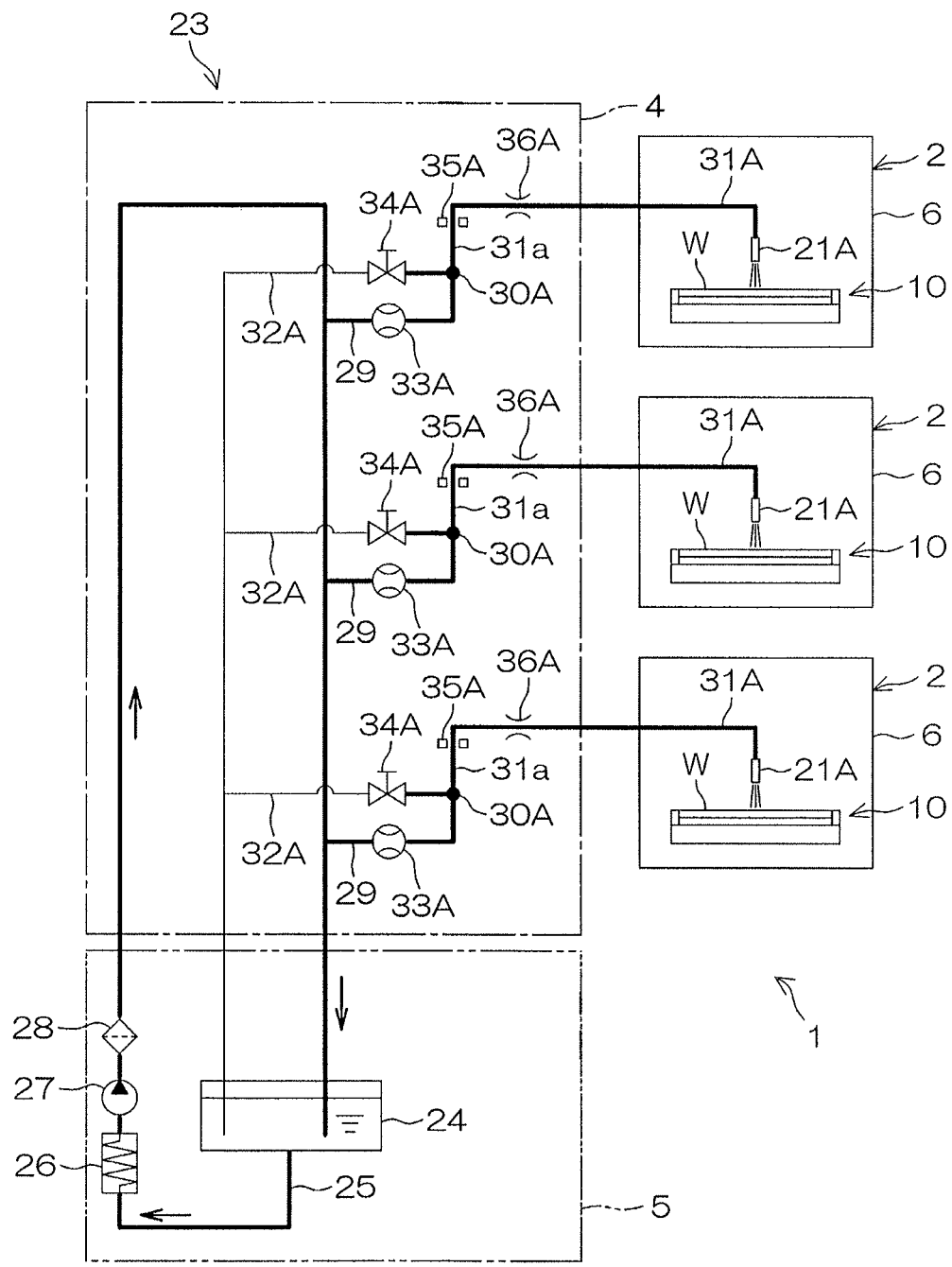
FIG. 9 is a schematic view which shows the chemical liquid supplying device when discharge of the chemical liquid is executed.
Figure 10:
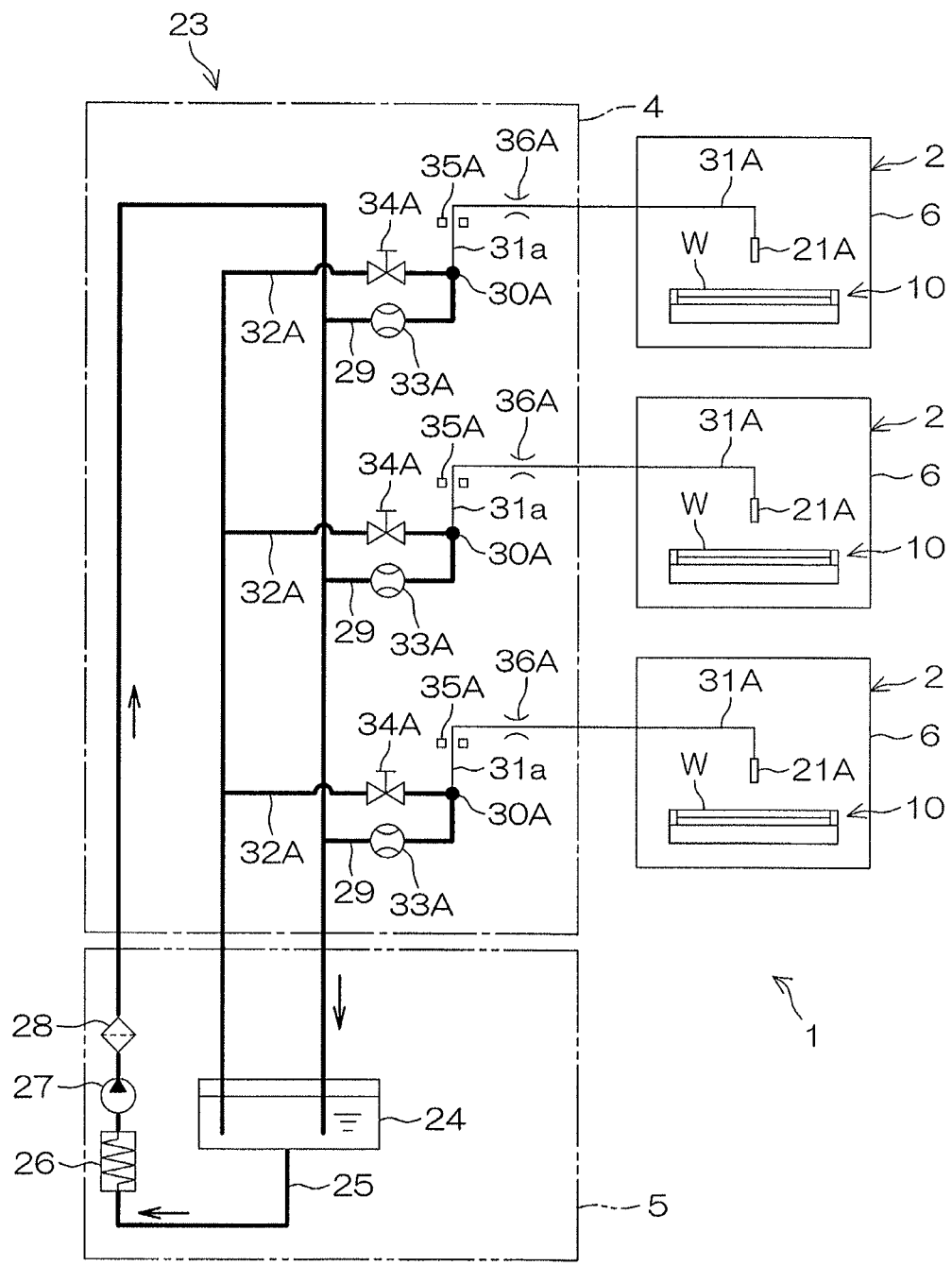
FIG. 10 is a schematic view which shows the chemical liquid supplying device when discharge of the chemical liquid is stopped.

FIG. 9 is a schematic view which shows the chemical liquid supplying device 23 which executes discharge of the chemical liquid. FIG. 10 is a schematic view which shows the chemical liquid supplying device 23 when discharge of the chemical liquid is stopped.

As shown in FIG. 9, when the chemical liquid is discharged from the first chemical liquid nozzle 21A, the controller 3 switches the first discharge valve 34A from the first discharge stop state to the first discharge execution state. Thereby, the pressure loss through the first return piping 32A is larger than the pressure loss through the first supply piping 31A. Therefore, the chemical liquid inside the common piping 29 is supplied from the common piping 29 to the first supply piping 31A and supplied from the first supply piping 31A to the first chemical liquid nozzle 21A. Thereby, the chemical liquid is discharged from the first chemical liquid nozzle 21A to the substrate W.

As shown in FIG. 10, when discharge of the chemical liquid from the first chemical liquid nozzle 21A is stopped, the controller 3 switches the first discharge valve 34A from the first discharge execution state to the first discharge stop state. Thereby, the pressure loss through the first return piping 32A is smaller than the pressure loss through the first supply piping 31A. Therefore, the chemical liquid inside the common piping 29 is not supplied from the common piping 29 to the first supply piping 31A but supplied from the common piping 29 to the first return piping 32A. The chemical liquid supplied to the first return piping 32A is returned to the tank 24 to circulate through the circulation piping 25 again.

As described above, the first flowmeter 33A detects a flow rate of the chemical liquid which flows through the common piping 29. Since the pressure loss through the first supply piping 31A is larger than the pressure loss through the first return piping 32A, a larger resistance is applied to the chemical liquid inside the common piping 29 when discharge of the chemical liquid is executed than when discharge of the chemical liquid is stopped. Therefore, the chemical liquid during execution of discharge of the chemical liquid is smaller in flow rate than the chemical liquid during stop of discharge of the chemical liquid. Therefore, it is possible to confirm that the chemical liquid flows from the common piping 29 to the first supply piping 31A by detecting a flow rate of the chemical liquid flowing through the common piping 29.

Further, the first liquid detecting sensor 35A detects whether the chemical liquid is present at a detection position inside the elevating portion 31a of the first supply piping 31A or not. When discharge of the chemical liquid is stopped, the elevating portion 31a can be expected to be empty. Further, when discharge of the chemical liquid is executed, the elevating portion 31a is to be filled with the chemical liquid. After discharge of the chemical liquid is stopped, the chemical liquid remaining at the elevating portion 31a flows toward the first return piping 32A due to a suction force and gravity resulting from the chemical liquid which flows from the common piping 29 to the first return piping 32A, and the elevating portion 31a can be expected to be empty.

On occurrence of the abnormality in which the chemical liquid is supplied from the common piping 29 to the first supply piping 31A although discharge of the chemical liquid is stopped, a liquid surface of the chemical liquid rises along the elevating portion 31a to fill the elevating portion 31a with the chemical liquid. The above-described abnormality can be detected by detecting the presence or absence of the chemical liquid at the elevating portion 31a. It is also possible to confirm supply of the chemical liquid to the first supply piping 31A when discharge of the chemical liquid is executed. Further, it is possible to confirm that the first supply piping 31A is made empty after discharge of the chemical liquid is stopped.

Detection values of the first flowmeter 33A and the first liquid detecting sensor 35A are input into the controller 3. On occurrence of the above-described abnormality, the controller 3 may allow the pump 27 to stop supply of the chemical liquid. Further, the controller 3 may allow an alarm device to raise an alarm, thereby notifying a person in charge of the substrate processing apparatus 1 of the abnormality. The alarm device may be a display device which displays a message, a speech generation device which raises warning sounds or a device which uses two or more of messages, sounds and light to notify the abnormality.

As described above, in the first preferred embodiment, whether discharge of the chemical liquid from the first chemical liquid nozzle 21A is executed or stopped is not switched by opening or closing the first supply piping 31A with the use of an opening/closing valve but switched by changing a magnitude relationship between the pressure loss through the first supply piping 31A and the pressure loss through the first return piping 32A. The first supply piping 31A is not closed by the opening/closing valve but always open except for a period during which abnormality is occurring. Therefore, foreign matter contained in the chemical liquid supplied to the first chemical liquid nozzle 21A is smaller in amount, as compared with a case where the first supply piping 31A is opened and closed by the opening/ closing valve. Thereby, it is possible to suppress or prevent contamination of the substrate W by foreign matter contained in the chemical liquid and also to improve cleanliness of the substrate W.

Further, since the first supply piping 31A is always open, in a state where discharge of the chemical liquid is stopped, a negative pressure resulting from the chemical liquid flowing from the common piping 29 to the first return piping 32A is applied to the interior of the first supply piping 31A. The chemical liquid remaining at the first chemical liquid nozzle 21A and the first supply piping 31A is drawn by the negative pressure to the first return piping 32A and flows into the first return piping 32A. Thereby, the chemical liquid remaining at the first chemical liquid nozzle 21A and the first supply piping 31A can be decreased in amount. As a result, it is possible to suppress or prevent occurrence of a phenomenon (what is called "dripping") in which droplets of the chemical liquid drop intermittently from the first chemical liquid nozzle 21A although discharge of the chemical liquid from the first chemical liquid nozzle 21A is stopped.

In addition, even if the first discharge valve 34A is not completely closed, that is, the valve element 43 is not in contact with the valve seat 44 when the opening degree is smallest, the first discharge valve 34A has a movable portion and, therefore, particles can be generated at the first discharge valve 34A. That is, the particles may mix into the chemical liquid which flows through the first return piping 32A. However, the chemical liquid flowing through the first return piping 32A is returned to the tank 24 to circulate through the circulation piping 25. Foreign matter contained in the chemical liquid is removed by the filter 28 during circulation through the circulation piping 25. Therefore, it is possible to avoid discharge of particles generated at the first discharge valve 34A together with the chemical liquid from the first chemical liquid nozzle 21A and to suppress or prevent contamination of the substrate W.

In the first preferred embodiment, the chemical liquid supplied to the first chemical liquid nozzle 21A is heated or cooled upstream of the first supply piping 31A. When discharge of the chemical liquid is stopped, the chemical liquid is not supplied from the common piping 29 to the first supply piping 31A but supplied from the common piping 29 to the first return piping 32A. At this time, a temperature of the first supply piping 31A is at or near a room temperature. Therefore, immediately after discharge of the chemical liquid is started, the chemical liquid will undergo a change in temperature in the first supply piping 31A or the first chemical liquid nozzle 21A.

The first supply piping 31A is shortened, by which it is possible to decrease a change in temperature of the chemical liquid in the first supply piping 31A. The first supply piping 31A becomes shorter as the first branching portion 30A comes closer to the first chemical liquid nozzle 21A. The first branching portion 30A is arranged inside the chamber 6 or the fluid box 4 and relatively close to the first chemical liquid nozzle 21A. Thereby, the first supply piping 31A can be shortened to decrease a change in temperature of the chemical liquid in the first supply piping 31A. It is, therefore, possible to supply the chemical liquid close to the intended temperature from the beginning to the substrate W.

Second Preferred Embodiment

Figure 11:
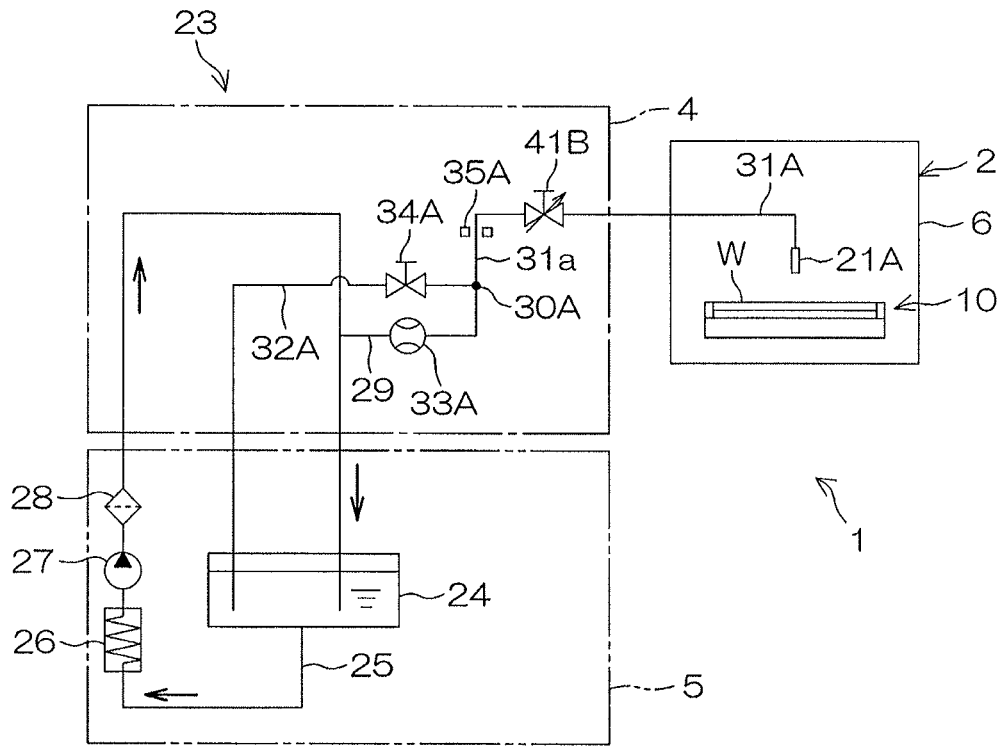
FIG. 11 is a schematic view which shows a chemical liquid supplying device according to a second preferred embodiment of the present invention.
Figure 12:
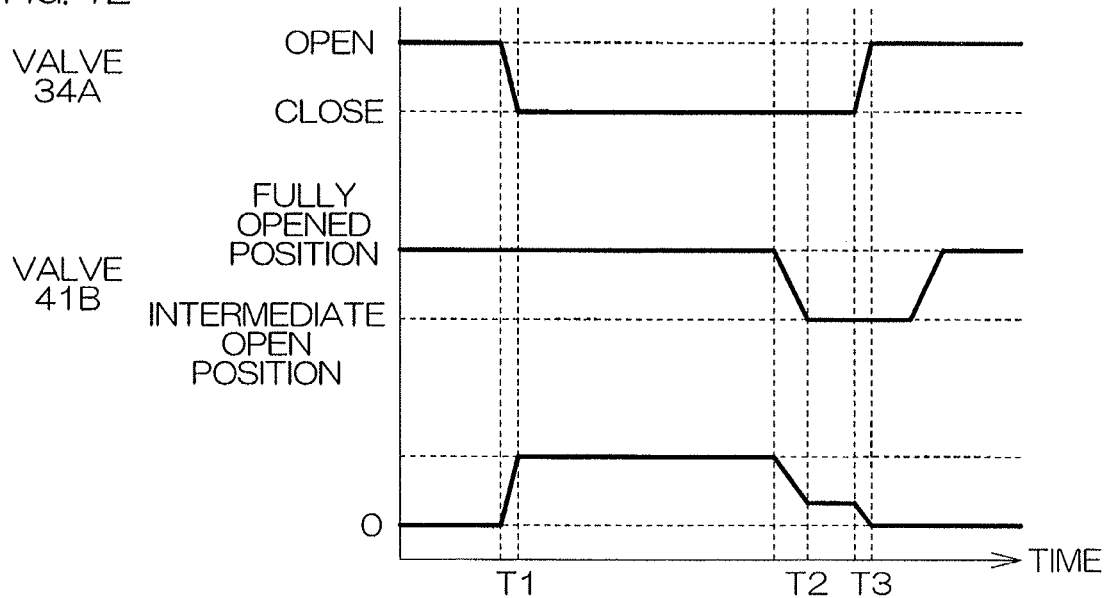
FIG. 12 is a graph which shows temporal changes in opening degrees of a discharge valve and a flow control valve and in flow rate of a chemical liquid discharged from a chemical liquid nozzle.

FIG. 11 is a schematic view which shows a chemical liquid supplying device 23 according to a second preferred embodiment of the present invention. FIG. 12 is a graph which shows temporal changes in opening degrees of a discharge valve and a flow control valve 41B and in flow rate of a chemical liquid discharged from a chemical liquid nozzle. In FIG. 11 and FIG. 12, configurations similar to the above described configurations shown in FIG. 1 to FIG. 10 will be given the same reference numbers as those of FIG. 1, etc., with a description thereof omitted.

As shown in FIG. 11, in the second preferred embodiment, the flow control valve 41B shown in FIG. 6 is disposed on first supply piping 31A in place of the first narrowing device 36A. The flow control valve 41B which is one example of the electric valve is able to change an opening degree to any given value. Therefore, it is possible to decrease a difference in pressure loss between a plurality of processing units 2.

As shown in FIG. 12, when a chemical liquid is discharged from a first chemical liquid nozzle 21A, a controller 3 moves a valve element 43 of a first discharge valve 34A from an open position to a closed position in a state where the valve element 43 of the flow control valve 41B is positioned at a fully opened position (Time T1 shown in FIG. 12). Thereby, the first chemical liquid nozzle 21A starts to discharge the chemical liquid and the chemical liquid discharged from the first chemical liquid nozzle 21A is increased in flow rate from zero.

Thereafter, the controller 3 moves the valve element 43 of the flow control valve 41B from the fully opened position to an intermediate open position in a state where the valve element 43 of the first discharge valve 34A is positioned at a closed position (Time T2 shown in FIG. 12). Thereby, the first supply piping 31A is increased in pressure loss. At this time, the chemical liquid discharged from the first chemical liquid nozzle 21A is decreased in flow rate to a value larger than zero.

Thereafter, the controller 3 moves the valve element 43 of the first discharge valve 34A from a closed position to an open position (Time T3 shown in FIG. 12). Thereby, a pressure loss through first return piping 32A is smaller than a pressure loss through the first supply piping 31A. Therefore, supply of the chemical liquid from common piping 29 to the first supply piping 31A is stopped, and the chemical liquid is supplied from the common piping 29 to the first return piping 32A. Therefore, the chemical liquid discharged from the first chemical liquid nozzle 21A is decreased in flow rate to zero to stop discharge of the chemical liquid from the first chemical liquid nozzle 21A.

In the second preferred embodiment, the following effects can be obtained in addition to the effects according to the first preferred embodiment. Specifically, in the second preferred embodiment, the flow control valve 41B which is one example of the electric valve is disposed on the first supply piping 31A. When discharge of the chemical liquid is stopped, the controller 3 decreases an opening degree of the flow control valve 41B, while maintaining a state where the valve element 43 is separated from the valve seat 44 and, thereafter, increases an opening degree of the first discharge valve 34A. As described above, after the first supply piping 31A is increased in pressure loss, the first discharge valve 34A is increased in opening degree. Thus, it is possible to smoothly stop discharge of the chemical liquid, as compared with a case where the opening degree of the first discharge valve 34A is increased without decreasing the opening degree of the flow control valve 41B.

Further, in the first preferred embodiment, a description has been given of a case where on occurrence of the abnormality in the chemical liquid supplying device 23, the controller 3 allows the pump 27 to stop supply of the chemical liquid. On occurrence of the abnormality, in addition to, or in place of the fact that the controller 3 allows the pump 27 to stop supply of the chemical liquid, the controller 3 may move the valve element 43 of the flow control valve 41B to a closed position. In this case, since the first supply piping 31A is closed, it is possible to reliably prevent the first chemical liquid nozzle 21A from continuously discharging the chemical liquid, although discharge of the chemical liquid is stopped.

Third Preferred Embodiment

Figure 13:
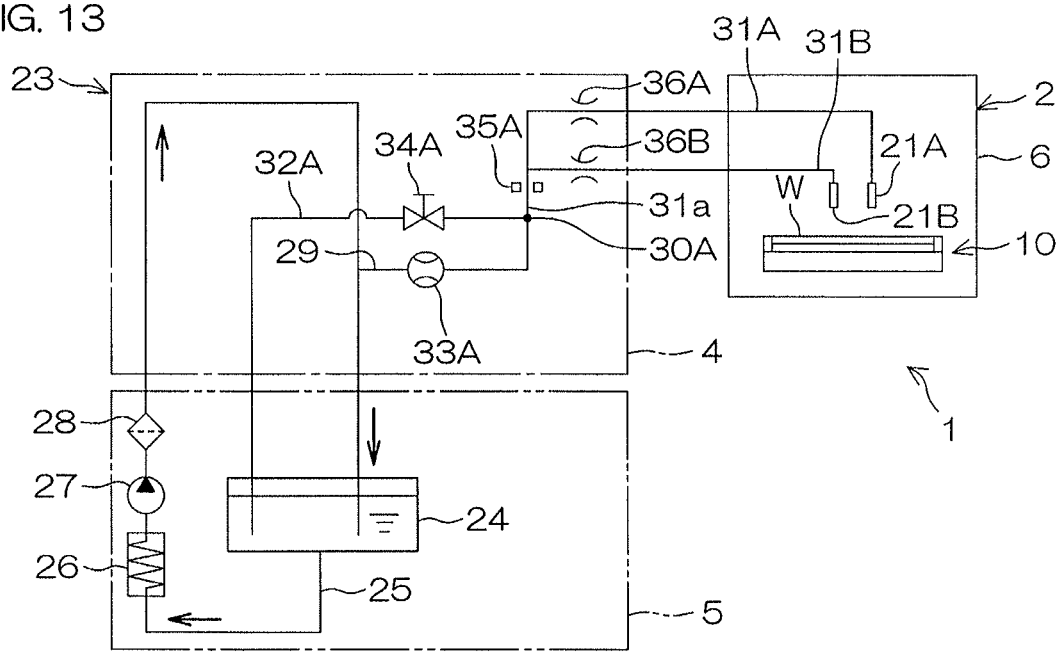
FIG. 13 is a schematic view which shows a chemical liquid supplying device according to a third preferred embodiment of the present invention.

FIG. 13 is a schematic view which shows a chemical liquid supplying device 23 according to a third preferred embodiment of the present invention. In FIG. 13, configurations similar to the above described configurations shown in FIG. 1 to FIG. 12 are given the same reference numbers as those of FIG. 1, etc., with a description thereof omitted.

In the third preferred embodiment, a substrate processing apparatus 1 includes a second chemical liquid nozzle 21B which discharges downward a chemical liquid to an upper surface of a substrate W held by a spin chuck 10, second supply piping 31B which guides the chemical liquid from first supply piping 31A to the second chemical liquid nozzle 21B, and a second narrowing device 36B which increases a pressure loss through the second supply piping 31B by decreasing a flow channel area of the second supply piping 31B. The second narrowing device 36B may be the flow control valve 41B shown in FIG. 6, the contracting portion 37A shown in FIG. 7, the orifice member 37B shown in FIG. 8, or may include at least two of them.

In the third preferred embodiment, the following effects can be obtained in addition to the effects according to the first preferred embodiment. Specifically, in the third preferred embodiment, a plurality of chemical liquid nozzles (a first chemical liquid nozzle 21A and a second chemical liquid nozzle 21B) are disposed. Therefore, even if first supply piping 31A and second supply piping 31B are further increased in pressure loss, it is possible to suppress a decrease in flow rate of a chemical liquid supplied to a substrate W. The first supply piping 31A and the second supply piping 31B are further increased in pressure loss, by which the chemical liquid is less likely to flow from the common piping 29 to the first supply piping 31A and the second supply piping 31B. Therefore, it is possible to suppress or prevent the chemical liquid from being accidentally supplied to the first chemical liquid nozzle 21A and the second chemical liquid nozzle 21B.

Where a surface of the substrate W is hydrophobic, it is necessary to supply a processing liquid to the surface of the substrate W at a large flow rate in order to cover an entire area of the substrate W with the processing liquid. If supply piping is narrowed to increase a pressure loss, there is a case that it is difficult to supply the chemical liquid to a front surface of the substrate W at a large flow rate. Even in this case, the supply piping is increased in number, thus making it possible to supply the chemical liquid to the front surface of the substrate W at a large flow rate, with a pressure loss through each of the supply piping improved. It is also possible to reliably prevent occurrence of dripping by making the supply piping narrow. Further, the supply piping is increased in number, thus making it possible to increase the number of chemical liquid nozzles and also to cause the chemical liquid to land on a plurality of landing positions within the upper surface of the substrate W. Thereby, even if the front surface of the substrate W is hydrophobic, it is possible to reliably cover an entire area of the substrate W with the chemical liquid.

Fourth Preferred Embodiment

Figure 14:
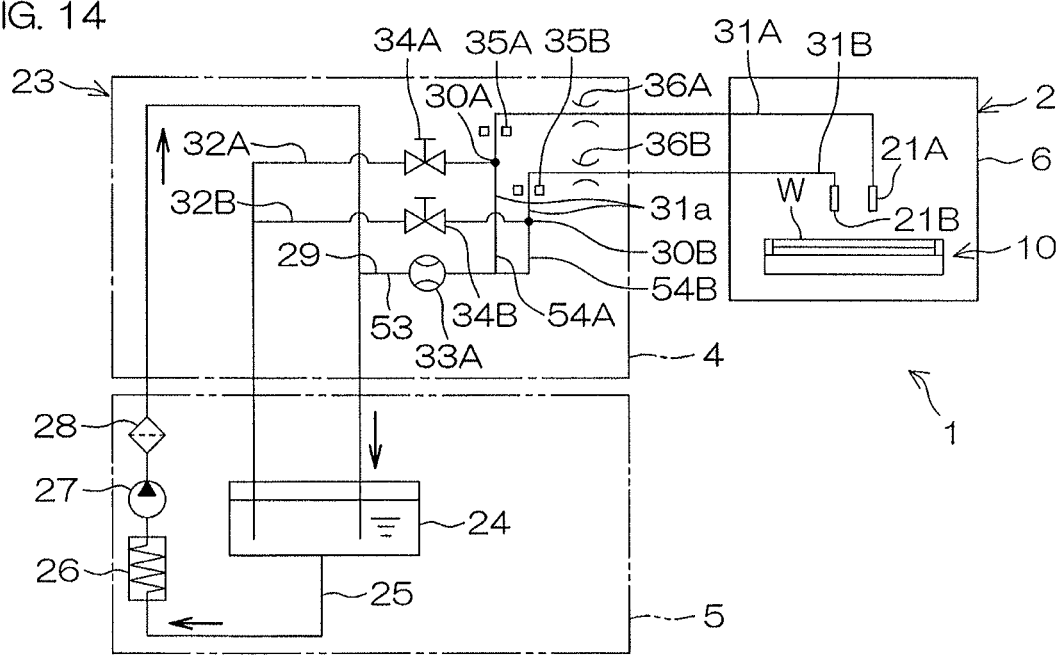
FIG. 14 is a schematic view which shows a chemical liquid supplying device according to a fourth preferred embodiment of the present invention.

FIG. 14 is a schematic view which shows a chemical liquid supplying device 23 according to a fourth preferred embodiment of the present invention. In FIG. 14, configurations similar to the above described configurations shown in FIG. 1 to FIG. 12 are given the same reference numbers as those of FIG. 1, etc., with a description thereof omitted.

In the fourth preferred embodiment, a substrate processing apparatus 1 includes second return piping 32B which guides a chemical liquid from a second branching portion 30B to a tank 24, a second discharge valve 34B which increases and decreases a flow channel area of the second return piping 32B and a second liquid detecting sensor 35B which detects whether the chemical liquid is present at a detection position inside second supply piping 31B or not, in addition to a second chemical liquid nozzle 21B, second supply piping 31B and a second narrowing device 36B.

Common piping 29 includes upstream common piping 53 which guides the chemical liquid sent by a pump 27, first downstream common piping 54A which guides the chemical liquid guided by the upstream common piping 53 to a first branching portion 30A and second downstream common piping 54B which guides the chemical liquid guided by the upstream common piping 53 to the second branching portion 30B. An upstream end of first supply piping 31A is connected to the first branching portion 30A. An upstream end of the second supply piping 31B is connected to the second branching portion 30B. A first liquid detecting sensor 35A and a second liquid detecting sensor 35B are respectively attached to an elevating portion 31A of the first supply piping 31A and that of the second supply piping 31B.

In the fourth preferred embodiment, the following effects can be obtained in addition to the effects according to the first preferred embodiment and the third preferred embodiment. Specifically, in the fourth preferred embodiment, when a first discharge valve 34A is closed in a state where the second discharge valve 34B is opened, only a first chemical liquid nozzle 21A discharges the chemical liquid. In contrast, when the second discharge valve 34B is closed in a state where the first discharge valve 34A is opened, only a second chemical liquid nozzle 21B discharges the chemical liquid. When both the first discharge valve 34A and the second discharge valve 34B are closed, both the first chemical liquid nozzle 21A and the second chemical liquid nozzle 21B discharge the chemical liquid. Therefore, it is possible to change a flow rate of the chemical liquid supplied to the substrate W in a range larger than zero.

Fifth Preferred Embodiment

Figure 15:
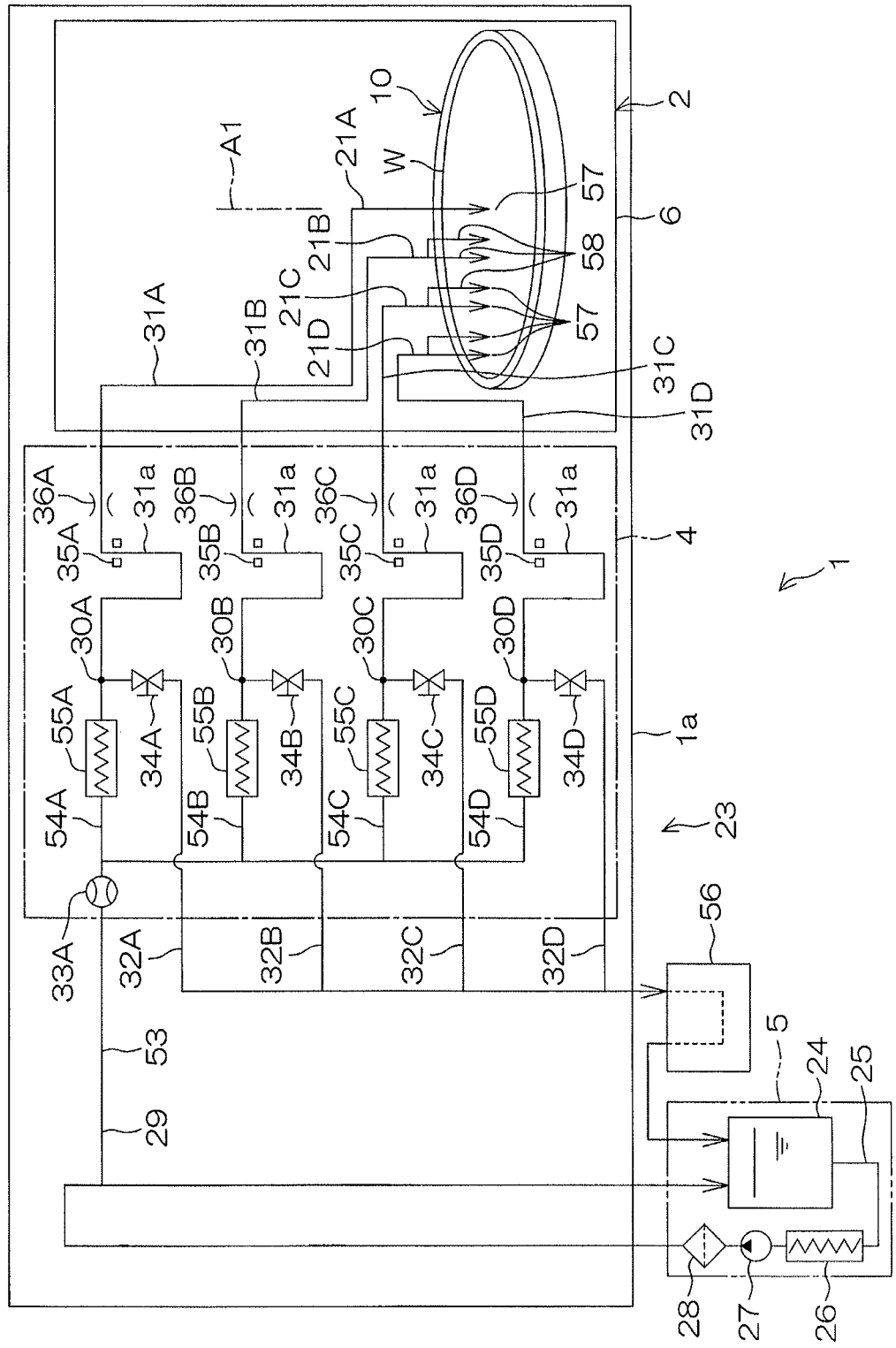
FIG. 15 is a schematic view which shows a chemical liquid supplying device according to a fifth preferred embodiment of the present invention.

FIG. 15 is a schematic view which shows a chemical liquid supplying device 23 according to a fifth preferred embodiment of the present invention. In FIG. 15, configurations similar to the above described configurations shown in FIG. 1 to FIG. 14 are given the same reference numbers as those of FIG. 1, etc., with a description thereof omitted.

In the following description, in order to express a configuration which corresponds to a first chemical liquid nozzle 21A, a second chemical liquid nozzle 21B, a third chemical liquid nozzle 21C and a fourth chemical liquid nozzle 21D, "first," "second," "third" and "fourth" may be added at the beginning of each name, and "A," "B," "C" and "D" may be added at the end of each name. In FIG. 15, for the same purpose, "A," "B," "C" or "D" is added at the end thereof. For example, a reference number of "54D" shown in FIG. 15 indicates fourth return piping 54D which corresponds to the fourth chemical liquid nozzle 21D.

In the fourth preferred embodiment, the third chemical liquid nozzle 21C and the fourth chemical liquid nozzle 21D, each of which discharges the chemical liquid downward toward the upper surface of the substrate W held by the spin chuck 10, are disposed on the substrate processing apparatus 1, in addition to the first chemical liquid nozzle 21A and the second chemical liquid nozzle 21B.

Supply piping 31A to 31D, return piping 32A to 32D, discharge valves 34A to 34D, liquid detecting sensors 35A to 35D and narrowing devices 36D to 36D are disposed respectively at the chemical liquid nozzles 21A to 21D. Further, downstream heaters 55A to 55D that further heat the chemical liquid heated by an upstream heater 26 are disposed respectively at the chemical liquid nozzles 21A to 21D. A plurality of return piping 32A to 32D are connected via a cooler 56 to a tank 24.

Common piping 29 includes third downstream common piping 54C that guides the chemical liquid guided by upstream common piping 53 to a third branching portion 30C and fourth downstream common piping 54D that guides the chemical liquid guided by the upstream common piping 53 to a fourth branching portion 30C, in addition to upstream common piping 53, first downstream common piping 54A and second downstream common piping 54B. The first downstream common piping 54A, the second downstream common piping 54B, the third downstream common piping 54C and the fourth downstream common piping 54D are each branched, for example, from the upstream common piping 53 inside a fluid box 4.

The first chemical liquid nozzle 21A includes a discharge port 57 connected to the first supply piping 31A. The second chemical liquid nozzle 21B includes a plurality of leading-end flow channels 58 branched from a downstream end of the second supply piping 31B and a plurality of discharge ports 57 individually connected to the plurality of leading-end flow channels 58. The above-described configuration of the second chemical liquid nozzle 21B is also applicable to the third chemical liquid nozzle 21C and the fourth chemical liquid nozzle 21D. The first chemical liquid nozzle 21A may include a plurality of leading-end flow channels 58 and a plurality of discharge ports 57. In contrast, the number of the discharge ports 57 disposed at the second chemical liquid nozzle 21B may be one. This is also applicable to the third chemical liquid nozzle 21C and the fourth chemical liquid nozzle 21D. The discharge port 57 discharges the chemical liquid supplied from a tank 24 to the upper surface of the substrate W. All the discharge ports 57 are arranged individually at a plurality of positions different in distance from a rotation axis A1 of the substrate W.

In the fifth preferred embodiment, the following effects are obtained, in addition to the effects according to the first preferred embodiment, the third preferred embodiment and the fourth preferred embodiment. Specifically, in the fifth preferred embodiment, the downstream heaters 55A to 55D that further heat the chemical liquid heated by the upstream heater 26 are respectively disposed at the chemical liquid nozzles 21A to 21D. Therefore, the chemical liquid which has landed on the substrate W can be changed in temperature, depending on a distance from the rotation axis A1 of the substrate W. The chemical liquid on the substrate W shows such a tendency that the temperature thereof is lowered with a rise in distance from the rotation axis A1. If the chemical liquid is raised in temperature with an increase in distance from the rotation axis A1 of the substrate W, it is possible to reduce a variation in temperature of the chemical liquid on the substrate W. Thereby, it is possible to improve uniformity of processing.

Other Preferred Embodiments

The present invention is not restricted to the contents of the above described preferred embodiments and various modifications are possible.

For example, the liquid stored in the tank 24 is not limited to a chemical liquid but may be other liquids such as a rinse liquid.

If a pressure loss through the first supply piping 31A is larger than a pressure loss through the first return piping 32A in a state where the first discharge valve 34A is fully opened, one of an elevating portion 31a of the first supply piping 31A and the first narrowing device 36A may be omitted.

The first liquid detecting sensor 35A may detect whether the chemical liquid is present at a portion of the first supply piping 31A other than the elevating portion 31a or not. If no first liquid detecting sensor 35A is needed, the first liquid detecting sensor 35A may be omitted. Similarly, a first flowmeter 33A may be omitted. At least, the upstream heater 26 may be omitted or the downstream heaters 55A to 55D may be omitted.

The first branching portion 30A may be arranged not only inside the fluid box 4 but also at other positions such as a portion inside a chamber 6.

In the second preferred embodiment, a controller 3 may switch the first discharge valve 34A from a first discharge execution state to a first discharge stop state without decreasing an aperture of a flow control valve 41B disposed on the first supply piping 31A.

The substrate processing apparatus 1 is not restricted to an apparatus that processes a disk-shaped substrate W and may be an apparatus that processes a polygonal substrate W.

Two or more arrangements among all the arrangements described above may be combined.

The present application corresponds to Japanese Patent Application No. 2017-031484 filed on Feb. 22, 2017 in the Japan Patent Office, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing apparatus comprising:
a substrate holding unit which holds a substrate;
a first nozzle which discharges a processing liquid toward the substrate held by the substrate holding unit;
a tank which stores the processing liquid to be supplied to the first nozzle;
circulation piping which circulates the processing liquid inside the tank, the circulation piping includes an upstream end and a downstream end each connected to the tank;
a liquid sending device which sends the processing liquid inside the tank to the circulation piping;
a filter which removes foreign matter from the processing liquid flowing through the circulation piping;
common piping which guides the processing liquid from the circulation piping to a first branching portion and includes an upstream end connected to the circulation piping and a downstream end connected to the first branching portion;

first supply piping which guides the processing liquid guided by the common piping from the first branching portion to the first nozzle and includes an upstream end connected to the first branching portion and a downstream end connected to the first nozzle;

first return piping which guides the processing liquid guided by the common piping from the first branching portion to the tank and includes an upstream end connected to the first branching portion and a downstream end connected to the tank;

a first pressure-loss setter which sets pressure losses such that a pressure loss through the first supply piping is larger than a pressure loss through the first return piping; and a first discharge valve which switches between a first discharge execution state in which the first discharge valve makes the pressure loss through the first return piping larger than the pressure loss through the first supply piping by decreasing a flow channel area of the first return piping such that the processing liquid inside the common piping flows from the common piping to the first supply piping, and a first discharge stop state in which the first discharge valve makes the pressure loss through the first return piping smaller than the pressure loss through the first supply piping by making the flow channel area of the first return piping larger than that in the first discharge execution state such that the processing liquid inside the common piping flows from the common piping to the first return piping.

2. The substrate processing apparatus according to claim 1, wherein
the first pressure-loss setter includes at least one of
an elevating portion which is a portion of the first supply piping and extends upward toward a downstream side in a flow direction of the processing liquid,
a contracting portion which is a portion of the first supply piping and tapered toward the downstream side in the flow direction of the processing liquid, and
an orifice member which includes at least one through hole through which the processing liquid passes and arranged on the first supply piping.

3. The substrate processing apparatus according to claim 2, wherein the first pressure-loss setter includes: an electric valve which includes a valve body defining an inner flow channel through which the processing liquid flows; a valve element which is arranged inside the inner flow channel; and an electric actuator which makes the valve element stationary at any given position.

4. The substrate processing apparatus according to claim 1, wherein
the first pressure-loss setter includes an elevating portion which is a portion of the first supply piping and extends upward toward a downstream side in a flow direction of the processing liquid, and
the substrate processing apparatus further comprises a first liquid detecting sensor which detects whether the processing liquid is present in the elevating portion or not.

5. The substrate processing apparatus according to claim 4, further comprising:
a controller which is configured and programmed to cause the liquid sending device to stop sending of the processing liquid when the first discharge valve is in the first discharge stop state and the first liquid detecting sensor detects that the processing liquid is present in the elevating portion.

6. The substrate processing apparatus according to claim 4, wherein
the first pressure-loss setter further includes an electric valve which includes: a valve body defining an inner flow channel through which the processing liquid flows; a valve element which is arranged inside the inner flow channel; and an electric actuator which makes the valve element stationary at any given position, wherein
the substrate processing apparatus further comprises a controller which is configured and programmed to stop flow of the processing liquid through the first supply piping such that no processing liquid flows from the first branching portion to the first nozzle by closing the electric valve when the first discharge valve is in the first discharge stop state and the first liquid detecting sensor detects that the processing liquid is present in the elevating portion.

7. The substrate processing apparatus according to claim 1, wherein
the first pressure-loss setter includes an electric valve which includes: a valve body defining an inner flow channel through which the processing liquid flows; a valve element which is arranged inside the inner flow channel; and an electric actuator which makes the valve element stationary at any given position, and
the substrate processing apparatus further comprises a controller which is configured and programmed to decrease an opening degree of the electric valve before the first discharge valve is switched from the first discharge execution state to the first discharge stop state.

8. The substrate processing apparatus according to claim 1 further comprising a first flowmeter which detects a flow rate of the processing liquid flowing through the common piping.

9. The substrate processing apparatus according to claim 1, wherein
the substrate processing apparatus further comprises a chamber which houses the substrate holding unit, a fluid box which is arranged laterally of the chamber, and a temperature controller which changes a temperature of the processing liquid to be supplied to the first nozzle by at least one of heating and cooling at a position upstream of the first supply piping, and
the first branching portion is arranged inside the chamber or the fluid box.

10. The substrate processing apparatus according to claim 1, wherein
the substrate processing apparatus further comprises a second nozzle which discharges the processing liquid toward the substrate held by the substrate holding unit and second supply piping which guides the processing liquid from the first supply piping to the second nozzle and which is always open such that the processing liquid flows from the first supply piping to the second nozzle through the second supply piping,
the first pressure-loss setter sets a pressure loss through the first supply piping and the second supply piping such that the pressure loss through the first supply piping and the second supply piping is larger than the pressure loss through the first return piping, and
the first discharge valve switches between the first discharge execution state in which the first discharge valve makes the pressure loss through the first return piping larger than the pressure loss through the first supply piping and the second supply piping by decreasing the flow channel area of the first return piping such that the processing liquid inside the common piping flows from the common piping to the first supply piping and the second supply piping and the first discharge stop state in which the first discharge valve makes the pressure loss through the first return piping smaller than the pressure loss through the first supply piping and the second supply piping by making the flow channel area of the first return piping larger than that in the first discharge execution state such that the processing liquid inside the common piping flows from the common piping to the first return piping.

11. The substrate processing apparatus according to claim 1, wherein the common piping includes upstream common piping which guides the processing liquid sent by the liquid sending device, first downstream common piping which guides the processing liquid guided by the upstream common piping to the first branching portion and second downstream common piping which guides the processing liquid guided by the upstream common piping to a second branching portion, the substrate processing apparatus further comprises a second nozzle which discharges the processing liquid toward the substrate held by the substrate holding unit, second supply piping which guides the processing liquid guided by the common piping from the second branching portion to the second nozzle and which is always open such that the processing liquid flows from the second branching portion to the second nozzle through the second supply piping, second return piping which guides the processing liquid guided by the common piping from the second branching portion along a channel different from the second supply piping, a second pressure-loss setter which sets pressure losses such that a pressure loss through the second supply piping is larger than a pressure loss through the second return piping, and a second discharge valve which switches between a second discharge execution state in which the second discharge valve makes the pressure loss through the second return piping larger than the pressure loss through the second supply piping such that the processing liquid inside the common piping flows from the common piping to the second supply piping by decreasing a flow channel area of the second return piping, and a second discharge stop state in which the second discharge valve makes the pressure loss through the second return piping smaller than the pressure loss through the second supply piping such that the processing liquid inside the common piping flows from the common piping to the second return piping by making the flow channel area of the second return piping larger than that in the second discharge execution state.

12. The substrate processing apparatus according to claim 1, wherein the first supply piping is always open such that the processing liquid flows from the first branching portion to the first nozzle through the first supply piping.

13. The substrate processing apparatus according to claim 1, wherein the circulation piping guides the processing liquid from the tank to the tank, and the common piping is different from the circulation piping.

14. A substrate processing apparatus comprising:

a substrate holding unit which holds a substrate;

a first nozzle which discharges a processing liquid toward the substrate held by the substrate holding unit;

a liquid sending device which sends the processing liquid to be supplied to the substrate held by the substrate holding unit;

common piping which guides the processing liquid sent by the liquid sending device to a first branching portion;

first supply piping which guides the processing liquid guided by the common piping from the first branching portion to the first nozzle;

first return piping which guides the processing liquid guided by the common piping from the first branching portion along a channel different from the first supply piping;

a first pressure-loss setter which sets pressure losses such that a pressure loss through the first supply piping is larger than a pressure loss through the first return piping; and a first discharge valve which switches between a first discharge execution state in which the first discharge valve makes the pressure loss through the first return piping larger than the pressure loss through the first supply piping by decreasing a flow channel area of the first return piping such that the processing liquid inside the common piping flows from the common piping to the first supply piping, and a first discharge stop state in which the first discharge valve makes the pressure loss through the first return piping smaller than the pressure loss through the first supply piping by making the flow channel area of the first return piping larger than that in the first discharge execution state such that the processing liquid inside the common piping flows from the common piping to the first return piping; wherein the first pressure-loss setter is provided in the first supply piping and downstream of the first branching portion; and the first pressure-loss setter includes at least one of an elevating portion which is a portion of the first supply piping and extends upward toward a downstream side in a flow direction of the processing liquid, a contracting portion which is a portion of the first supply piping and tapered toward the downstream side in the flow direction of the processing liquid, and an orifice member which includes at least one through hole through which the processing liquid passes and arranged on the first supply piping.

15. The substrate processing apparatus according to claim 14, wherein the first supply piping is always open such that the processing liquid flows from the first branching portion to the first nozzle through the first supply piping.

16. A substrate processing apparatus comprising:

a substrate holding unit which holds a substrate;

a first nozzle which discharges a processing liquid toward the substrate held by the substrate holding unit;

a liquid sending device which sends the processing liquid to be supplied to the substrate held by the substrate holding unit;

common piping which guides the processing liquid sent by the liquid sending device to a first branching portion;

first supply piping which guides the processing liquid guided by the common piping from the first branching portion to the first nozzle;

first return piping which guides the processing liquid guided by the common piping from the first branching portion along a channel different from the first supply piping;

a first pressure-loss setter which sets pressure losses such that a pressure loss through the first supply piping is larger than a pressure loss through the first return piping; and a first discharge valve which switches between a first discharge execution state in which the first discharge valve makes the pressure loss through the first return piping larger than the pressure loss through the first supply piping by decreasing a flow channel area of the first return piping such that the processing liquid inside the common piping flows from the common piping to the first supply piping, and a first discharge stop state in which the first discharge valve makes the pressure loss through the first return piping smaller than the pressure loss through the first supply piping by making the flow channel area of the first return piping larger than that in the first discharge execution state such that the processing liquid inside the common piping flows from the common piping to the first return piping; wherein the first pressure-loss setter includes an electric valve which includes: a valve body defining an inner flow channel through which the processing liquid flows; a valve element which is arranged inside the inner flow channel; and an electric actuator which makes the valve element stationary at any given position.

17. The substrate processing apparatus according to claim 16, wherein the first supply piping is always open such that the processing liquid flows from the first branching portion to the first nozzle through the first supply piping.

* * * * *